(12) United States Patent
Hsu

(10) Patent No.: US 11,309,419 B2
(45) Date of Patent: Apr. 19, 2022

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventor: Chao-Wei Hsu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 1 day.

(21) Appl. No.: 16/746,595

(22) Filed: Jan. 17, 2020

(65) Prior Publication Data

US 2021/0226051 A1 Jul. 22, 2021

(51) Int. Cl.
*H01L 29/78* (2006.01)
*H01L 21/8238* (2006.01)
*H01L 29/66* (2006.01)
*H01L 27/092* (2006.01)

(52) U.S. Cl.
CPC .... *H01L 29/785* (2013.01); *H01L 21/823821* (2013.01); *H01L 21/823878* (2013.01); *H01L 27/0924* (2013.01); *H01L 29/66795* (2013.01)

(58) Field of Classification Search
CPC ..... H01L 21/823821; H01L 21/823878; H01L 27/0924; H01L 21/823431; H01L 21/845; H01L 27/1211; H01L 27/0886; H01L 27/10879; H01L 29/41791; H01L 29/66795–66818; H01L 29/785–7856; H01L 2924/13067
See application file for complete search history.

(56) References Cited

U.S. PATENT DOCUMENTS

| | | | |
|---|---|---|---|
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 2017/0047256 A1* | 2/2017 | Cheng | H01L 21/823418 |
| 2019/0074224 A1* | 3/2019 | Xie | H01L 29/42392 |
| 2020/0295160 A1* | 9/2020 | Chen | H01L 21/3086 |

* cited by examiner

*Primary Examiner* — Cuong B Nguyen
(74) *Attorney, Agent, or Firm* — Maschoff Brennan

(57) ABSTRACT

A semiconductor device includes a semiconductor fin and a gate structure above the semiconductor fin. The semiconductor fin includes a bottom portion and a top portion above the bottom portion. The bottom portion and the top portion are made of different materials. The top portion includes a head part and a neck part between the head part and the bottom portion. The neck part has a width less than a width of the head part, and the neck part is in contact with the bottom portion.

20 Claims, 43 Drawing Sheets

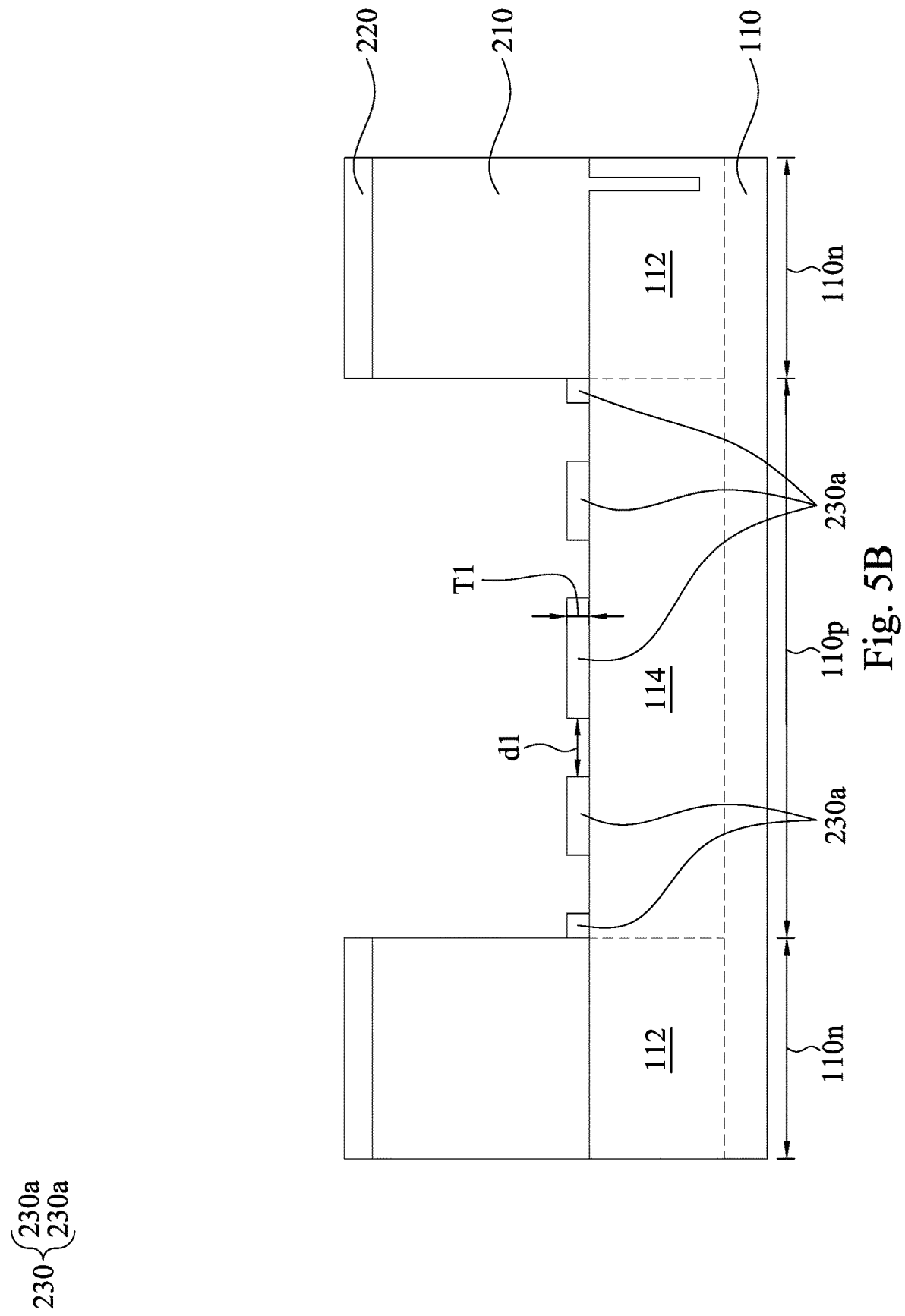

SEMICONDUCTOR DEVICE AND MANUFACTURING METHOD THEREOF

BACKGROUND

Semiconductor devices are used in a variety of electronic applications, such as, for example, personal computers, cell phones, digital cameras, and other electronic equipment. Semiconductor devices may be fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, and capacitors) by continual reductions in minimum feature size, which allow more components to be integrated into a given area. However, as the minimum feature sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
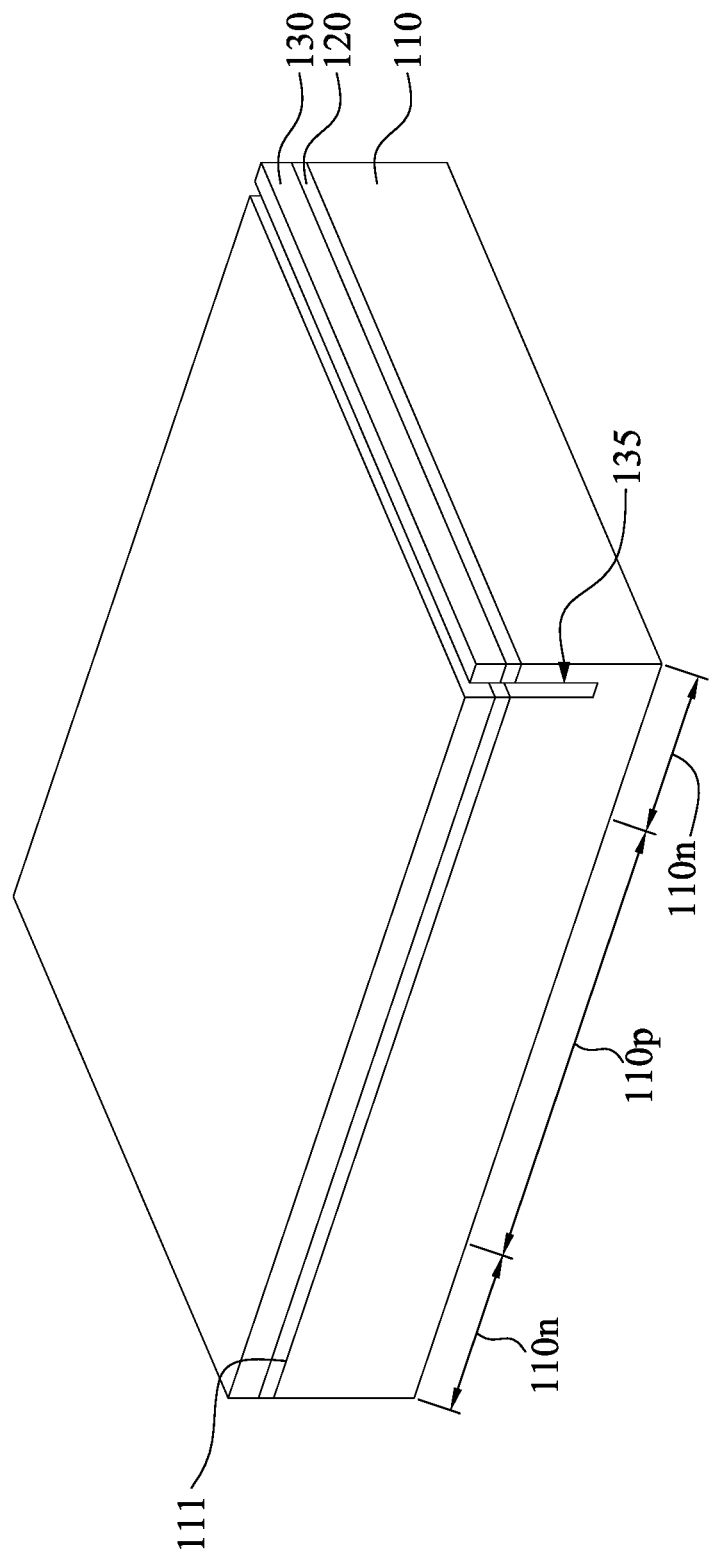
FIGS. 1-17E illustrate a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 Degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Some embodiments of the present disclosure relate to FinFET devices having a neck-shaped fin. The neck-shaped fin improves the current leakage problem, and the formation of the neck-shaped fin improves the etching performances of fins in different materials. These embodiments are discussed below in the context of forming FinFET transistors having multiple fins on a bulk semiconductor substrate.

FIGS. 1-17E illustrate a method for manufacturing a semiconductor device at various stages in accordance with some embodiments of the present disclosure. Reference is made first to FIG. 1. A substrate 110 is provided. The substrate 110 includes at least one N-type region 110*n* and at least one P-type region 110*p*. At least one N-type device will be formed on the N-type region 110*n*, and at least one P-type device will be formed on the P-type region 110*p*. For ease of explanation, it is assumed that in FIGS. 1-17E, the substrate 110 includes two of the N-type regions 110*n* and a single one of the P-type regions 110*p*. In some embodiments, the substrate 110 may include silicon (Si). Alternatively, the substrate 110 may include germanium (Ge), silicon germanium (SiGe), gallium arsenide (GaAs) or other appropriate semiconductor materials. In some embodiments, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or another appropriate method. In various embodiments, the substrate 110 may include any of a variety of substrate structures and materials.

In some embodiments, the backside of the substrate 110 may be cleaned by a chemical spray from one or more nozzles in addition to a physical clean by a brush (e.g., scrub brush). One or more sprays of chemical may also be incident the backside of the substrate 110. In some embodiments, a top surface 111 of the substrate 110 is cleaned to remove particulates and/or contaminants, which may include organic and/or metallic materials.

Next, a pad layer 120 is formed on the top surface 111 of the substrate 110. The pad layer 120 can prevent the substrate 110 from being damaged by subsequent ion implantation. The pad layer 120 can be formed by a deposition process, such as chemical vapor deposition (CVD) and/or atomic layer deposition (ALD). CVD is a deposition process in which a deposited species is formed as a result of a chemical reaction between gaseous reactants at greater than room temperature, in which a solid product of the reaction is deposited on the surface on which a film, coating, or layer of the solid product is to be formed. Variations of CVD processes include, but are not limited to, atmospheric pressure CVD (APCVD), low pressure CVD (LPCVD), plasma enhanced CVD (EPCVD), metal-organic CVD (MOCVD) and combinations thereof, and such variations may also be employed. Alternatively, the pad layer 120 may be formed using a growth process, such as thermal oxidation or thermal nitridation. In some embodiments, the pad layer 120 is made of oxide, such as $SiO_2$, that is formed by CVD.

A patterned mask layer 130 is then formed on the pad layer 120 to be used as an ion implantation mask, and a mark 135 is formed in the substrate 110 through the pad layer 120 and the mask layer 130. The mark 135 may be formed using an etching process, and is configured to mark the position of the substrate 110. Hence, the positions of implanted regions can be determined in the substrate 110 according to the position of the mark 135. In some embodiments, the mark 135 is a recess as shown in FIG. 1. However, in some other embodiments, the mark 135 may be other suitable configurations, and the claimed scope is not limited in this respect.

Figure 2:
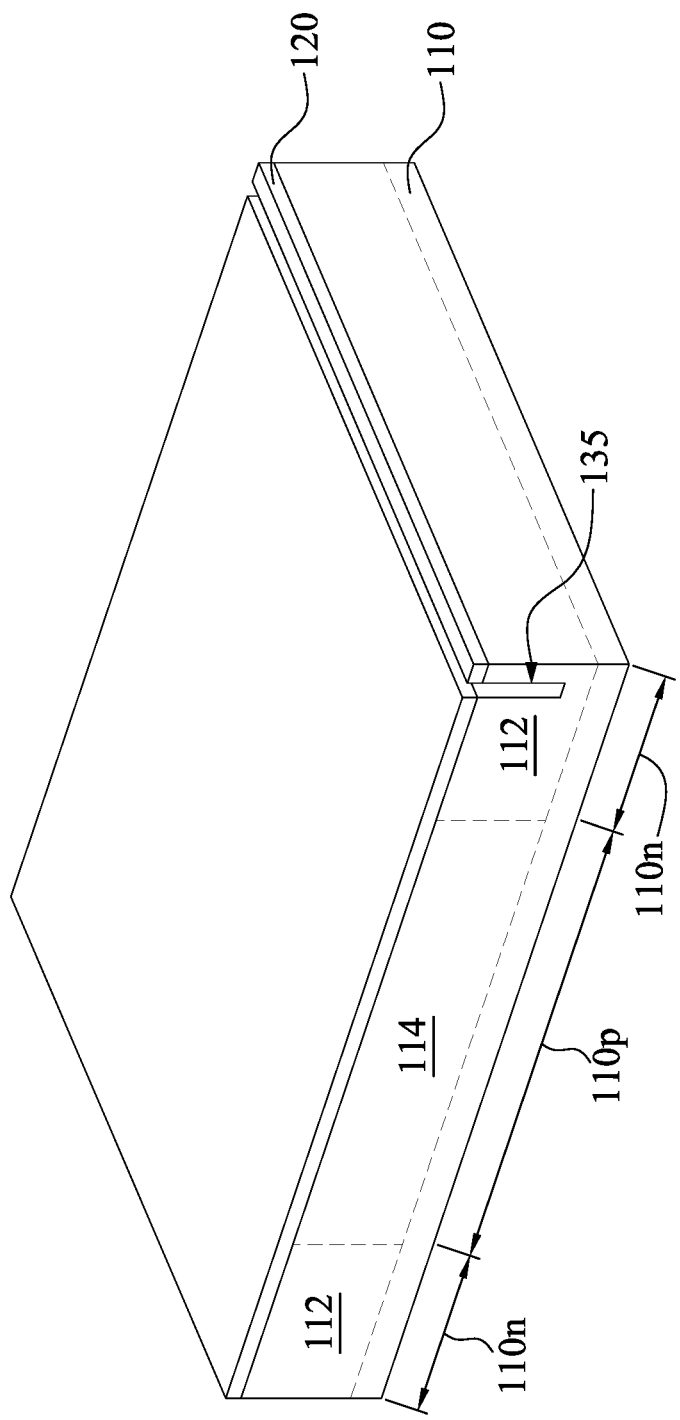

Reference is made to FIG. 2. The mask layer 130 in FIG. 1 is removed. Subsequently, at least one N-well 112 and at least one P-well 114 are formed in the substrate 110. For ease of explanation, it is assumed that in FIG. 2, two of the N-wells 112 and a single one of the P-wells 114 are formed in the substrate 110. The N-wells 112 are respectively formed above the N-type regions 110n of the substrate 110, and the P-well 114 is formed above the P-type region 110p of the substrate 110. In the description to follow, it is assumed that in embodiments including a plurality of the P-type regions 110p and a plurality of the P-wells 114, the same processes used (and concepts applied) for forming the single one of the P-type regions 110p and the single one of the P-wells 114 are repeated (equally applied) for the plurality of the P-type regions 110p and the P-wells 114. In FIG. 2, as an example, the N-wells 112 are formed in the substrate 110 by depositing a photoresist (not shown) over the substrate 110 and patterning the deposited photoresist to form a mask (not shown) having a pattern of the N-wells 112. The mask is used in an ion implantation performed to implant n-type dopants into the substrate 110 to form the N-wells 112. In some embodiments, the ion implantation is controlled by one or more of energy, dose, and implantation angle to implant the n-type dopants sufficiently deep into the substrate 110. In some embodiments, the n-type dopants may be arsenic, phosphorus, combinations thereof, or the like. In some embodiments, the dopant concentration of the N-wells 112 is less than about 1 atomic %. The mask is subsequently removed.

Following the above, the P-well 114 is formed in the substrate 110 by depositing another photoresist (not shown) over the substrate 110 and patterning the deposited photoresist to form another mask (not shown) having a pattern of the P-well 114. The mask is used in an ion implantation performed to implant p-type dopants into the substrate 110 to form the P-well 114. In some embodiments, the ion implantation is controlled by one or more of energy, dose, and implantation angle to implant the p-type dopants sufficiently deep into the substrate 110. In some embodiments, the p-type dopants may be boron, boron difluoride, combinations thereof, or the like. In some embodiments, the dopant concentration of the P-well 114 is less than about 1 atomic %. The mask is subsequently removed.

In FIG. 2, the P-well 114 is between two N-wells 112. It is noted that the arrangement of the N-wells 112 and P-well 114 in FIG. 2 is illustrative, and should not limit the present disclosure. Further, in some other embodiments, the P-well 114 is formed before the N-wells 112.

In some embodiments, the substrate 110 is a p-type doped substrate which is denoted as P-sub. Examples of p-type dopants in the p-doped substrate 110 include, but are not limited to, boron, gallium, and indium. In some embodiments, the substrate 110 includes a p-type doped silicon substrate. In some embodiments, a blanket ion implantation of boron is performed to form the p-type doped substrate before the formation of the N-wells 112 and the P-well 114.

Figure 3:
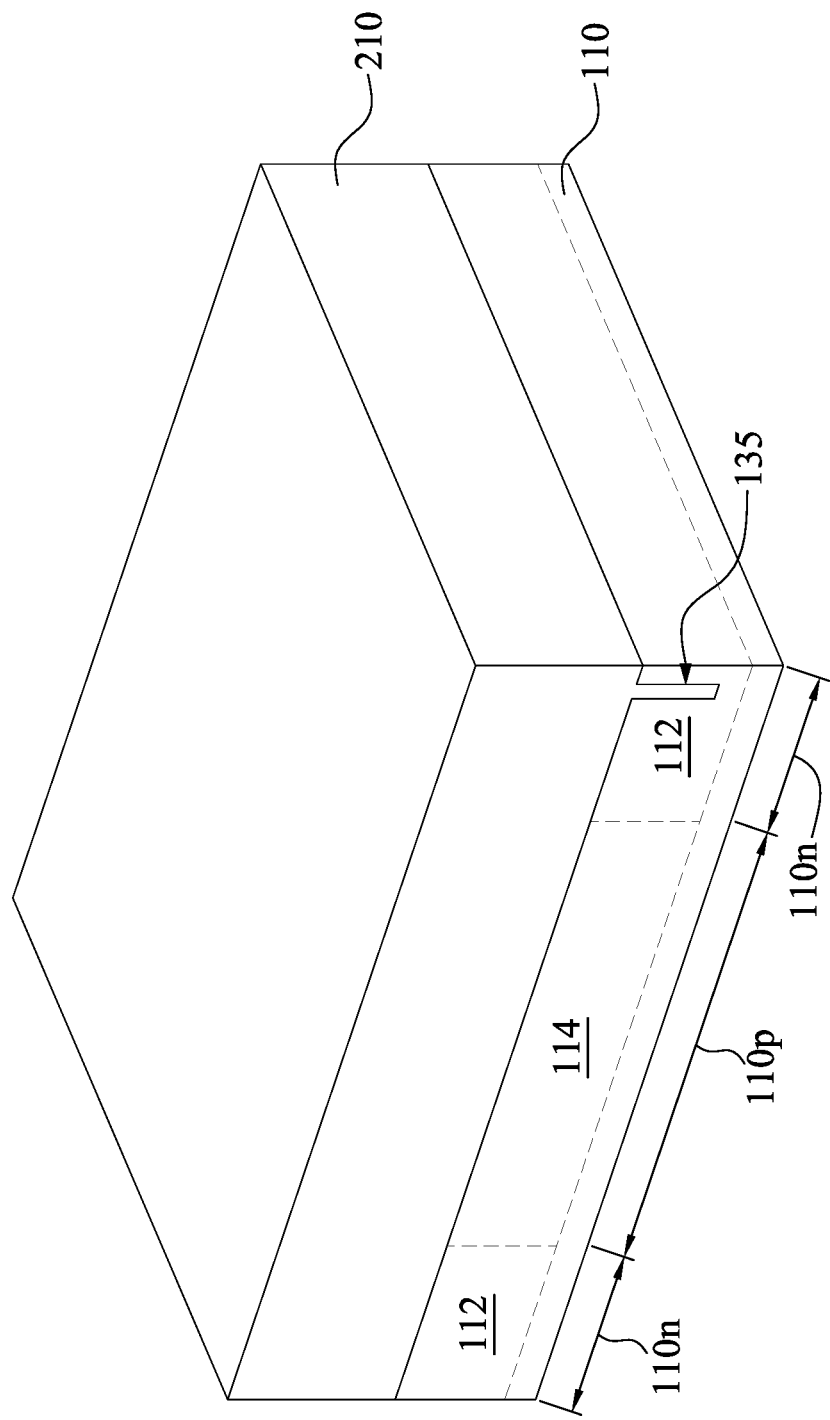

Reference is made to FIG. 3. The pad layer 120 of FIG. 2 is removed, and a first epitaxial layer 210 is formed above the substrate 110, through, for example, an epitaxial growth technique, such that the first epitaxial layer 210 covers the N-wells 112 and the P-well 114. In some embodiments, the first epitaxial layer 210 may be pure silicon layers that are free from germanium. The first epitaxial layer 210 may also be substantially pure silicon layers, for example, with a germanium percentage lower than about 1 percent. Furthermore, the first epitaxial layer 210 may be intrinsic and therefore not doped with p-type and n-type impurities. In some other embodiments, however, the first epitaxial layer 210 can be III-V materials, such as InAs, InGaAs, InGaAsSb, GaAs, InPSb, or other suitable materials. Additionally, while the first epitaxial layer 210 is described herein as being formed by epitaxy, the first epitaxial layer 210 may be formed using any suitable deposition or formation process.

Figure 4:
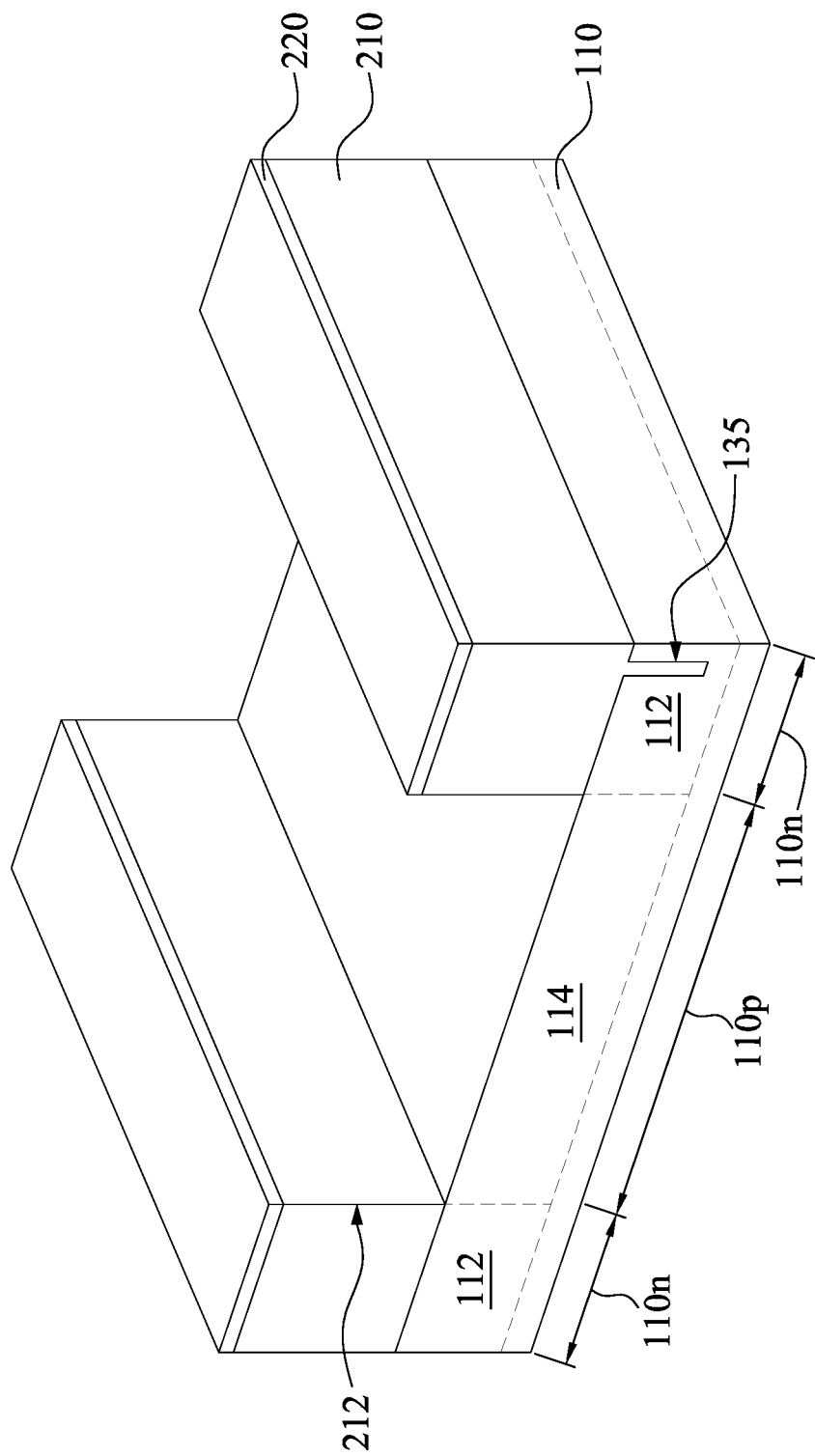

Reference is made to FIG. 4. A protection layer 220 is formed above the first epitaxial layer 210 and the N-type regions 110n of the substrate 110. In some embodiments, the protection layer 220 may be a hard mask layer including silicon nitride. In some other embodiments, the protection layer 220 may include multiple layers, e.g., an oxide layer and a nitride layer over the oxide layer.

The protection layer 220 exposes a portion of the first epitaxial layer 210 above the P-type region 110p of the substrate 110, and the exposed portion of the first epitaxial layer 210 is removed to form a recess 212 in the first epitaxial layer 210. Hence, the P-type region 110p of the substrate 110 is exposed from the recess 212 of the first epitaxial layer 210. The portion of the first epitaxial layer 210 exposed by the protection layer 220 may be removed by performing an etching process, e.g., a dry etching process, a wet etching process, or combinations thereof.

Figure 5A:
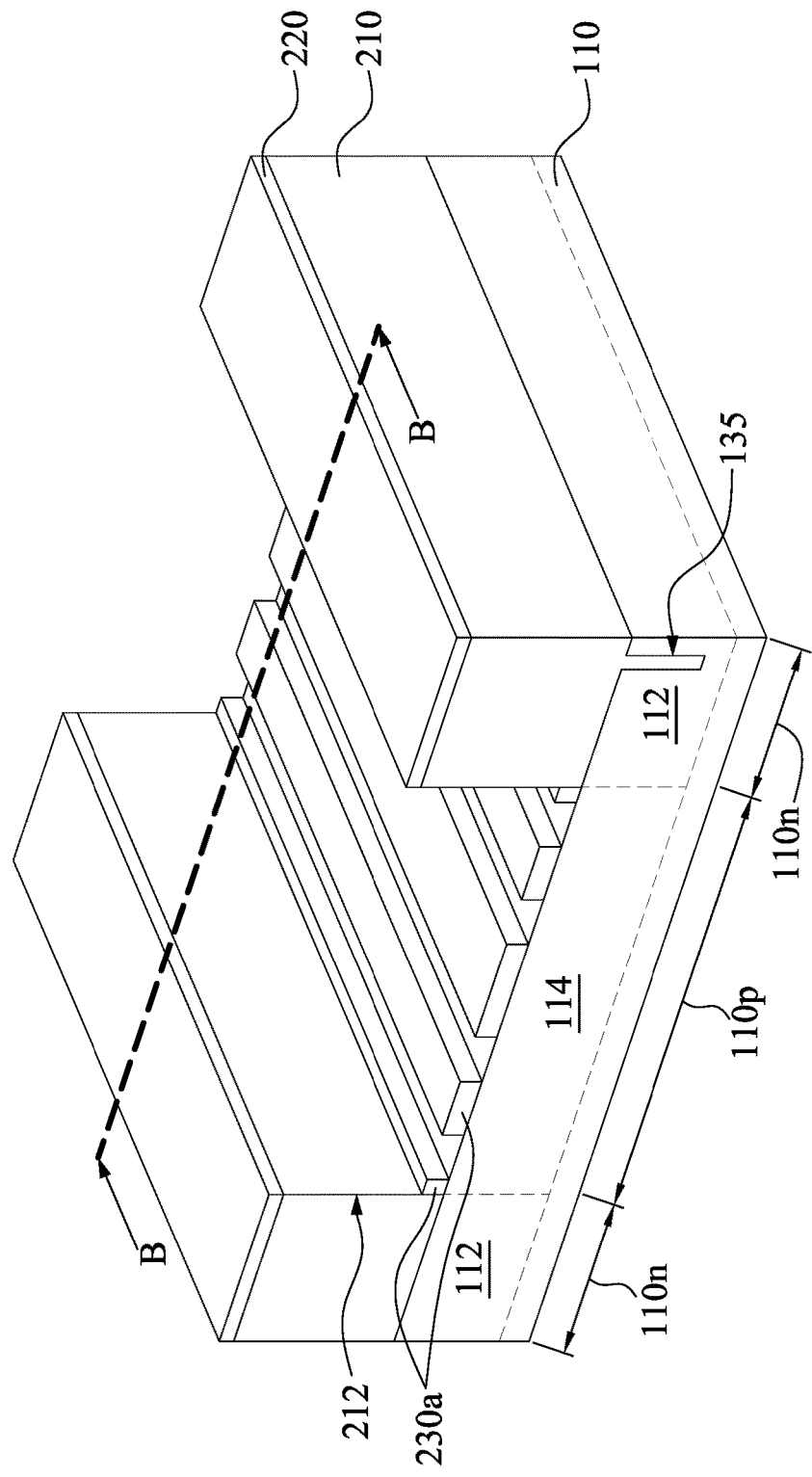

Reference is made to FIGS. 5A and 5B, where FIG. 5B is a cross-sectional view taken along line B-B in FIG. 5A. A patterned mask layer 230 is formed in the recess 212 and above the P-well 114 of the substrate 110. In some embodiments, a blanket mask layer is conformally formed above the structure in FIG. 4, and a patterning process is performed on the blanket mask layer to form the patterned mask layer 230 including plural mask portions 230a spaced apart from each other. In some embodiments, the patterned mask layer 230 may be a hard mask and may include silicon nitride, silicon dioxide, or other suitable materials.

The patterned mask layer 230 has an etching selectivity with respect to the first epitaxial layer 210 and a subsequently formed second epitaxial layer 250 (see FIGS. 7A and 7B), such that the patterned mask layer 230 is configured to modify the etching rates shown in FIGS. 9A and 9B. In some embodiments, the patterned mask layer 230 has a thickness T1 in a range of about 2 nm to about 20 nm. The thickness T1 and the material of the patterned mask layer 230 determine the etching depth D2 in the P-well 114 (see FIG. 9B). If the thickness T1 is greater than 20 nm, the etching depth D2 may be much less than the etching depth D1 (see FIG. 9B); if the thickness T1 is less than 2 nm, the etching depth D2 may be much greater than the etching depth D1. Either way, the etching depths D1 and D2 have a huge mismatch, resulting in reducing well-implant efficiency. In FIG. 5B, a distance d1 between adjacent mask portions 230a is in a range of about 15 nm to about 30 nm. If the distance d1 is less than about 15 nm, the critical dimension control of the patterned mask layer 230 may not be well-controlled; if the distance d1 is greater than about 30 nm, a neck part 256 (see FIGS. 9A and 9B) may not formed in second semiconductor fins 255 (see FIGS. 9A and 9B).

Figure 6A:
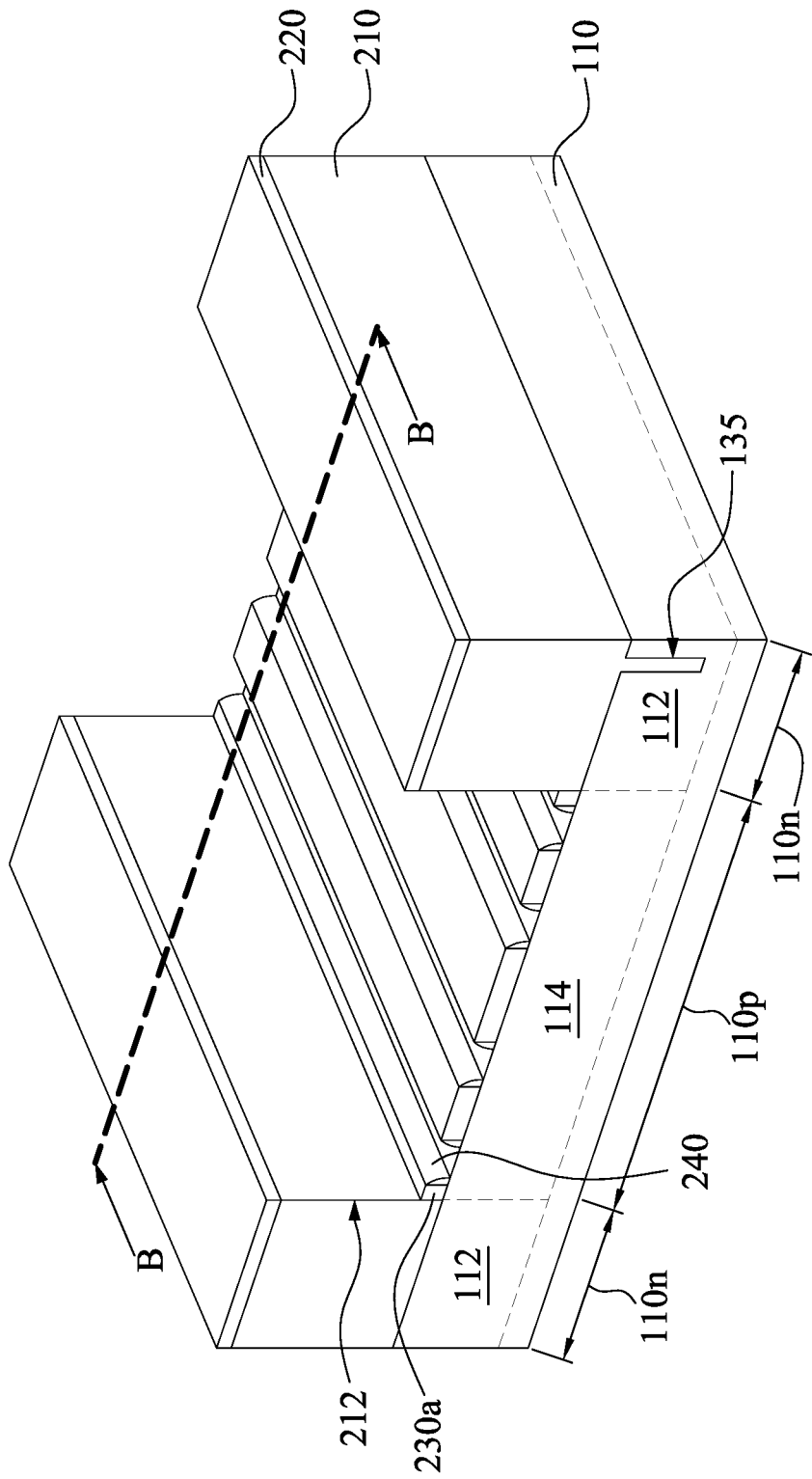
Figure 6B:
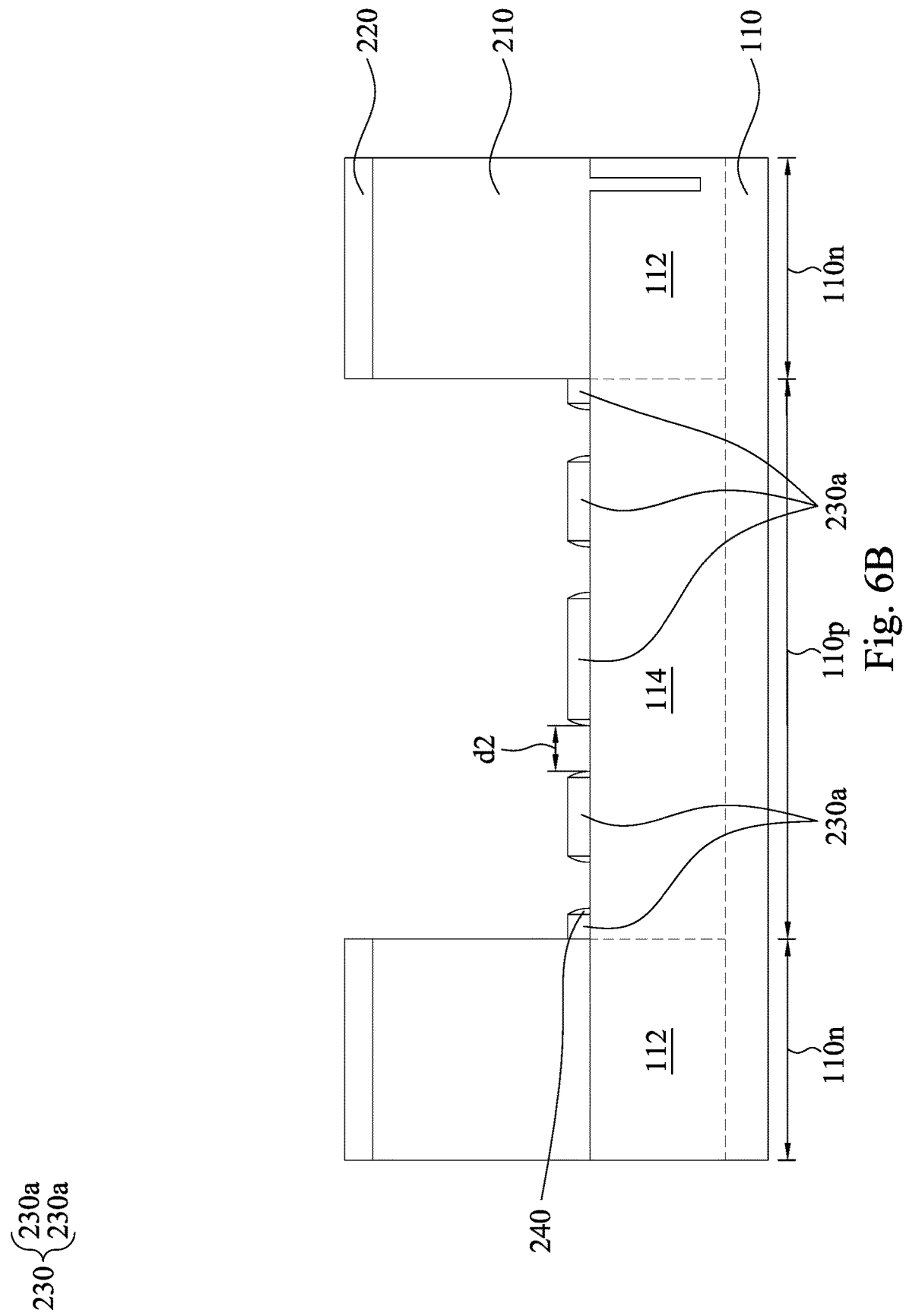

Reference is made to FIGS. 6A and 6B, where FIG. 6B is a cross-sectional view taken along line B-B in FIG. 6A. Spacer structures 240 are formed on opposite sides of each of the mask portions 230a. For example, a spacer layer is blanket formed over the structure in FIGS. 5A and 5B. The material of the spacer layer may be selected to have a high etching selectivity with respect to the mask layer 230, the first epitaxial layer 210, and the subsequently formed second epitaxial layer 250. For example, the material of the spacer layer may include SiN, SiO$_2$, SiOCN, AlO, AN, AlON, TaN, TiN, TiO, metals, metal alloys, combinations thereof, or the like. The spacer layer is formed as a conformal layer, with the thickness of its horizontal portions and the thickness of its vertical portions close to each other, for example, with a difference between the horizontal and vertical thickness smaller than about 20 percent of the horizontal thickness. An anisotropic etching process is then performed to remove the horizontal portions of the spacer layer, while the vertical portions of the spacer layer remain, and are referred to as the spacer structures 240 hereinafter. In some embodiments, the process for forming the spacer structures 240 is omitted if the patterned mask layer 230 can reach small critical dimension with good control.

In FIG. 6B, a space is formed between any two adjacent spacer structures 240, and a distance d2 between the two adjacent spacer structures 240 is about 5 nm to about 15 nm, e.g., about 10 nm. If the distance d2 is less than about 5 nm, the second epitaxial layer 250 (see FIGS. 7A and 7B) may not be easily formed; if the distance d2 is greater than about 15 nm, the subsequently formed second semiconductor fins 255 (see FIGS. 9A and 9B) may have a large width, which may result in leakage current.

Figure 7A:
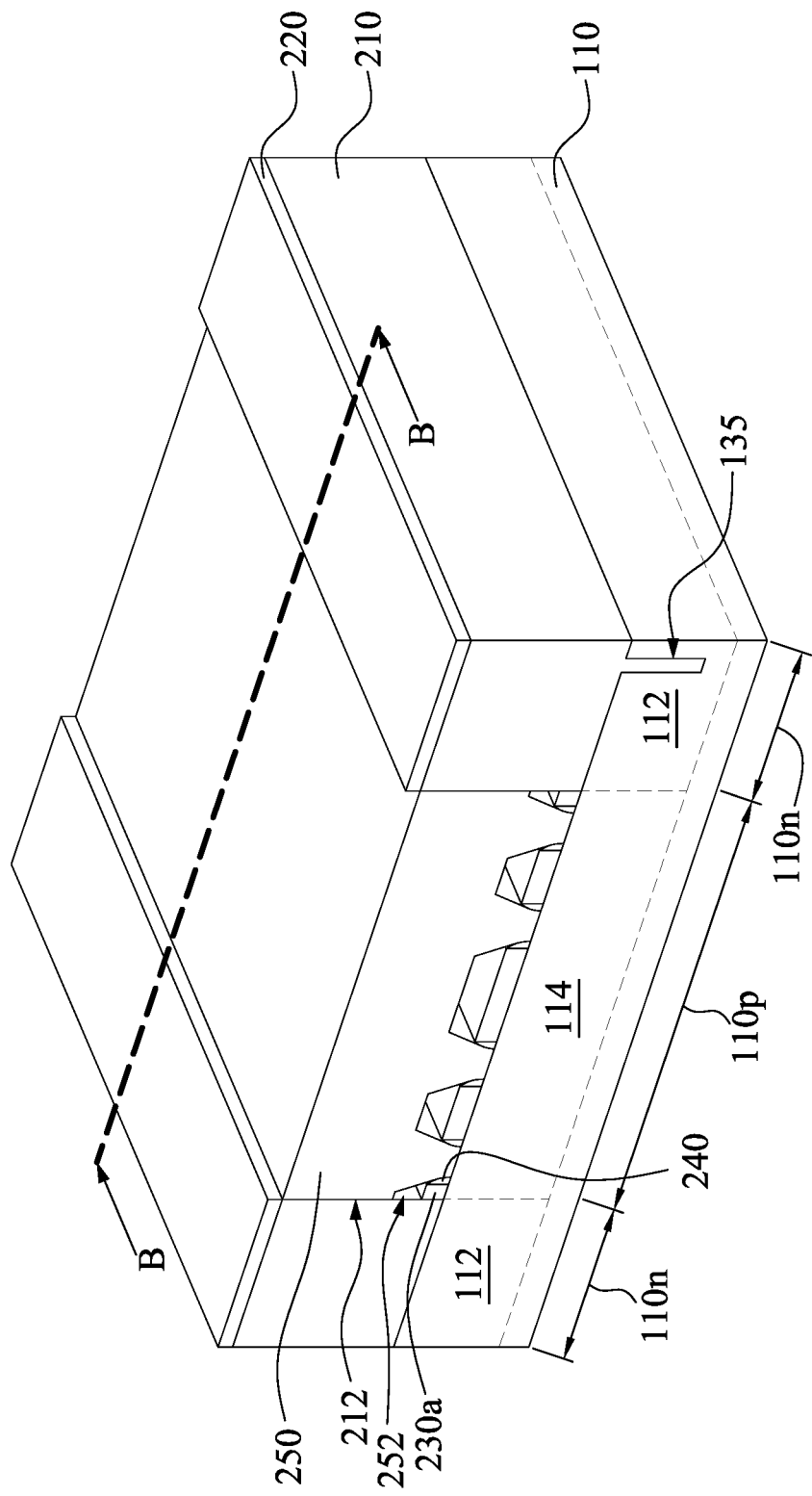
Figure 7B:
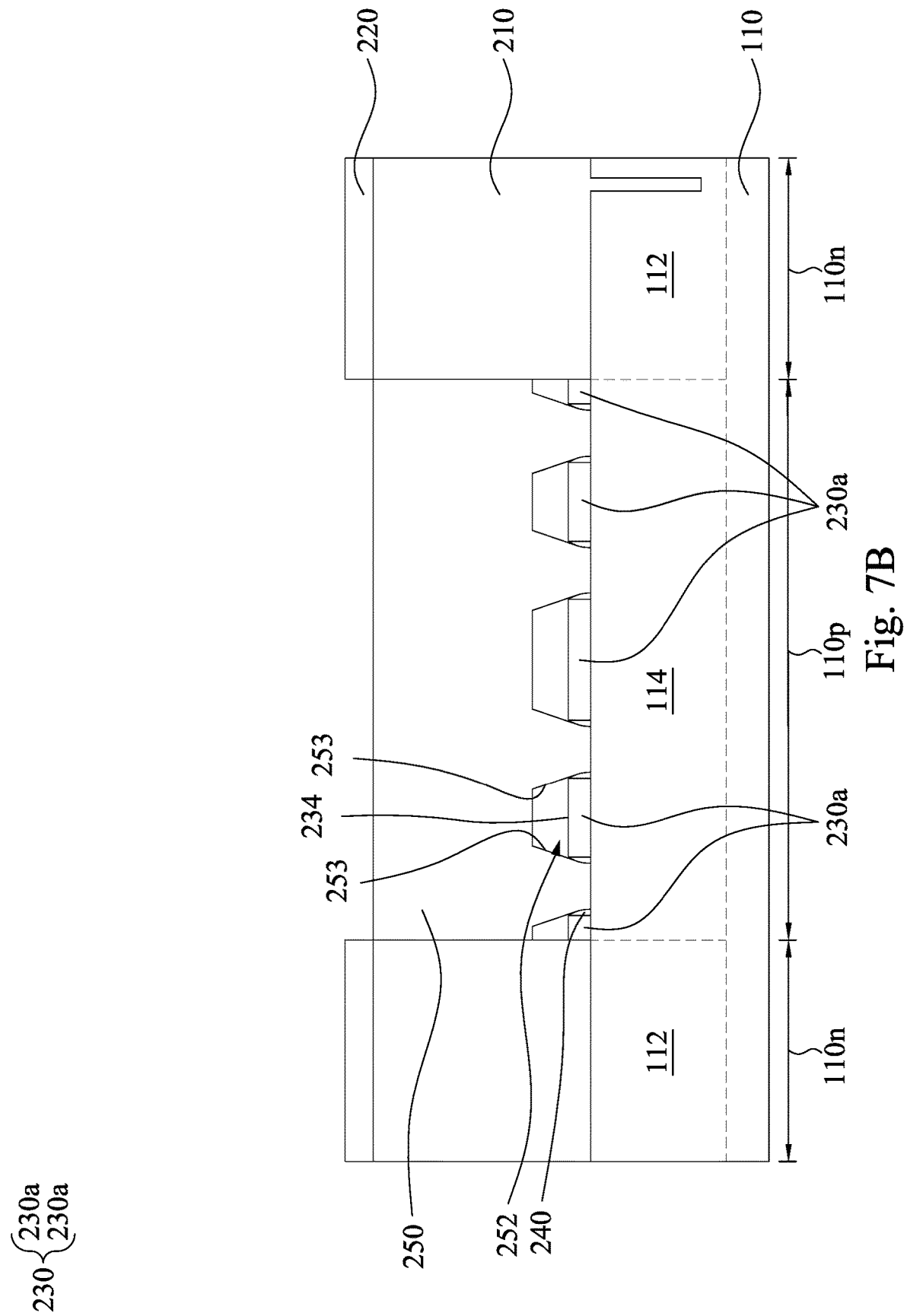

Reference is made to FIGS. 7A and 7B, where FIG. 7B is a cross-sectional view taken along line B-B in FIG. 7A. The second epitaxial layer 250 is formed in the recess 212 and above the patterned mask layer 230 and the spacer structures 240. The second epitaxial layer 250 is formed above the substrate 110, through, for example, a selective epitaxial growth technique, such that the second epitaxial layer 250 covers the P-well 114, the patterned mask layer 230, and the spacer structures 240. In some embodiments, the second epitaxial layer 250 is made of silicon germanium (SiGe). The germanium percentage (atomic percentage) of the second epitaxial layer 250 is in the range between about 15 percent and about 30 percent, e.g., about 25 percent, while higher or lower germanium percentages may be used. It is appreciated, however, that the values recited throughout the description are examples, and may be changed to different values.

In FIGS. 7A and 7B, the second epitaxial layer 250 is selectively formed on the portions of the substrate 110 exposed by the patterned mask layer 230 and the spacer structures 240. The second epitaxial layer 250 is formed along its crystalline orientations, such that voids 252 are respectively formed above the mask portions 230a. The second epitaxial layer 250 along sidewalls (facets) 253 of the voids 252 have a {111} surface orientation. The voids 252 are defined by the second epitaxial layer 250, the mask portions 230a, and the spacer structures 240. That is, a top surface 234 of each of the mask portions 230a is spaced apart from the second epitaxial layer 250.

Figure 8A:
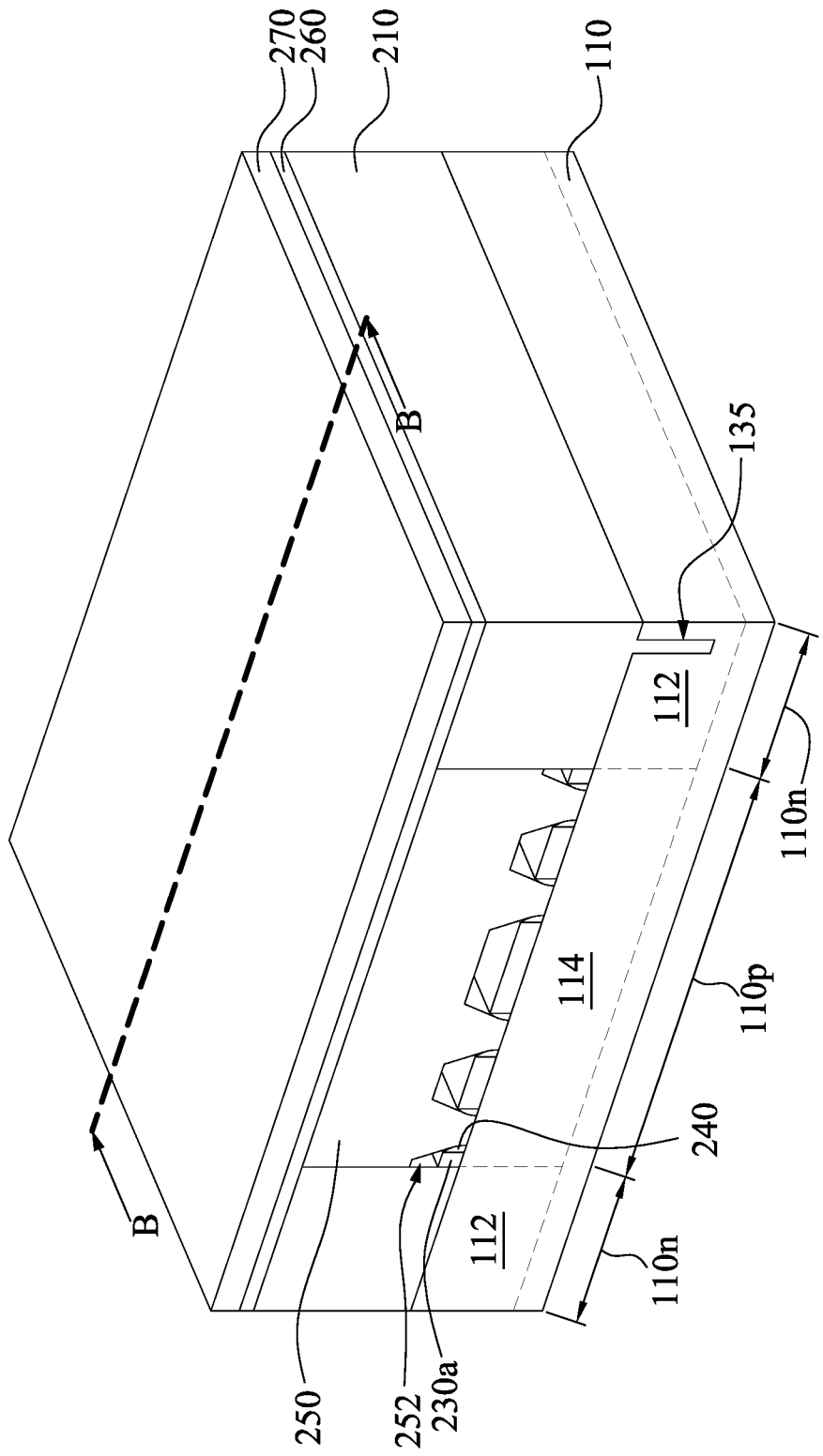
Figure 8B:
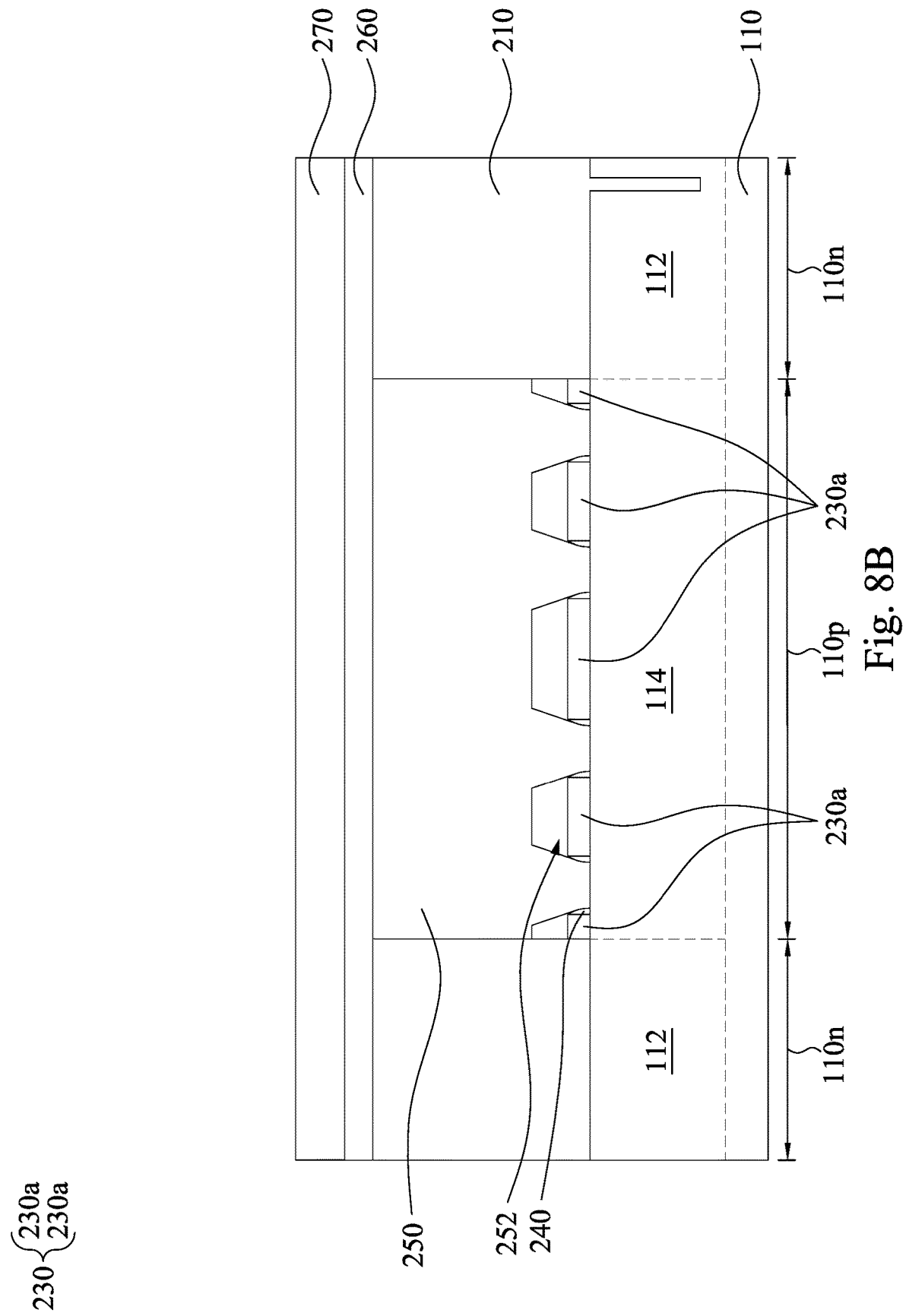

Reference is made to FIGS. 8A and 8B, where FIG. 8B is a cross-sectional view taken along line B-B in FIG. 8A. A planarization process, e.g., a chemical mechanical planarization (CMP) process, is performed to planarize the first epitaxial layer 210 and the second epitaxial layer 250, and the protection layer 220 (see FIGS. 7A and 7B) is removed in this process. Next, another pad layer 260 and another mask layer 270 are subsequently formed above the first epitaxial layer 210 and the second epitaxial layer 250. Since the formations and the materials of the pad layer 260 and the mask layer 270 may be similar to the formations and the materials of the pad layer 120 and the mask layer 130 in FIG. 1, a detailed description thereof is omitted hereinafter.

Figure 9A:
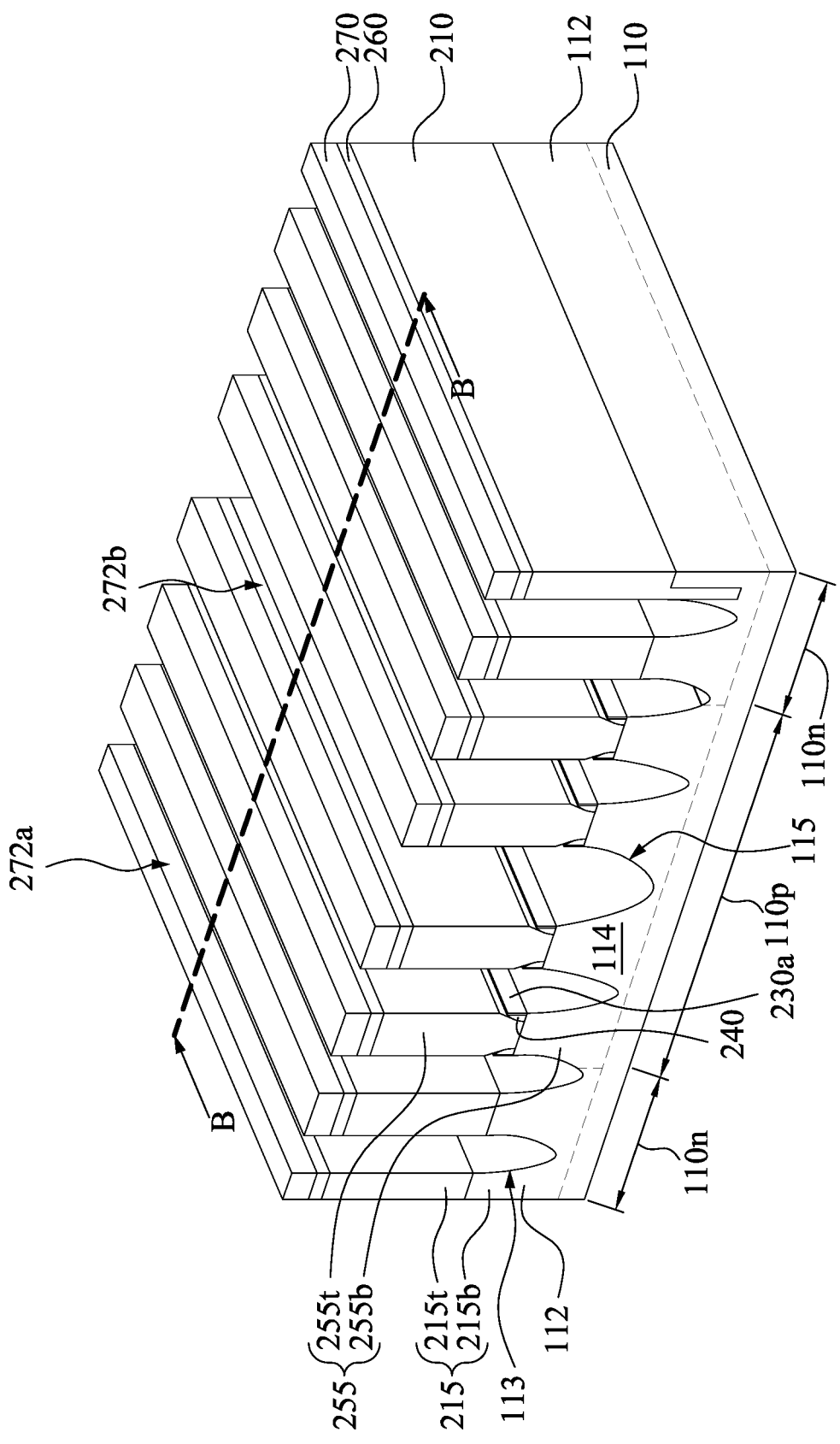
Figure 9B:
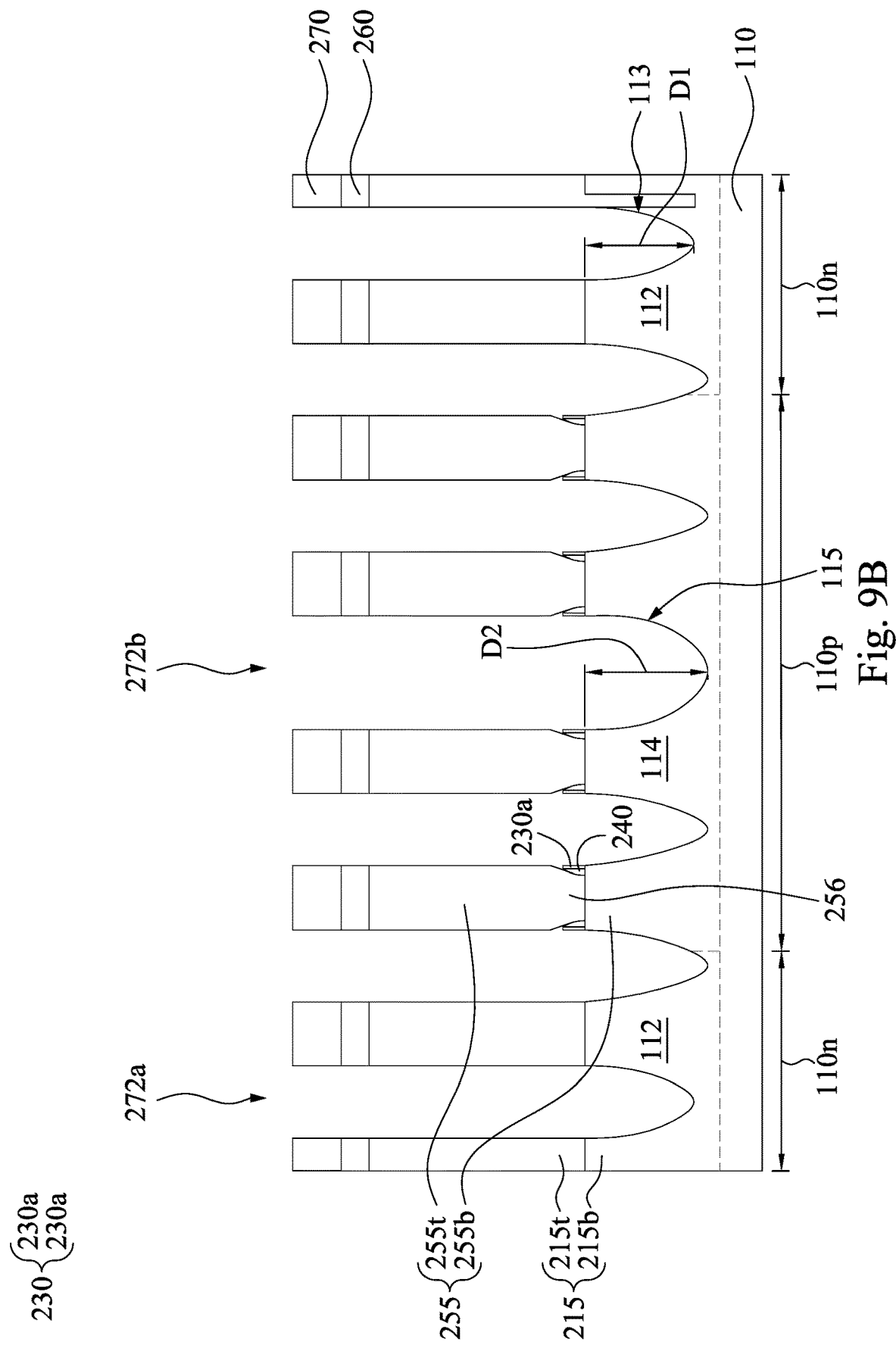

Reference is made to FIGS. 9A and 9B, where FIG. 9B is a cross-sectional view taken along line B-B in FIG. 9A. The pad layer 260 and the mask layer 270 of FIGS. 8A and 8B are patterned to form openings 272a and 272b therein, where the openings 272a are above the first epitaxial layer 210, and the openings 272b are above the second epitaxial layer 250. Further, the openings 272b are respectively right above the mask portions 230a, or at least overlap with the mask portions 230a. Subsequently, using the patterned pad layer 260 and the mask layer 270 as masks, the first epitaxial layer 210, the second epitaxial layer 250, and the substrate 110 are etched to form a plurality of first semiconductor fins 215 and the second semiconductor fins 255 (mentioned above) by various methods, including dry etching, wet etching, or a combination of dry etching and wet etching. The dry etching process may implement fluorine-containing gas (e.g., CF$_4$, SF$_6$, CH$_2$F$_2$, CHF$_3$, and/or C$_2$F$_6$), chlorine-containing gas (e.g., Cl$_2$, CHCl$_3$, CCl$_4$, and/or BCl$_3$), bromine-containing gas (e.g., HBr and/or CHBr$_3$), oxygen-containing gas, iodine-containing gas, other suitable gases and/or plasmas, or combinations thereof. The etching process may include multiple-step etching to gain etch selectivity, flexibility and a desired etch profile.

The etching rates in the first epitaxial layer 210 and the second epitaxial layer 250 may be different (or mismatched). For example, the etching rate in the second epitaxial layer 250 is higher than the etching rate in the first epitaxial layer 210. In FIG. 9B, the openings 272b are respectively right above the mask portions 230a, or at least overlap with the mask portions 230a, such that when the second epitaxial layer 250 is patterned, the voids 252 (see FIGS. 8A and 8B) and the mask portions 230a are exposed. As mentioned above, the mask portions 230a have a high etching selectivity with respect to the second epitaxial layer 250, such that the etching rate for forming the semiconductor fins 255 is reduced when the etching gases reach the mask portions 230a. While the etching rate in the second epitaxial layer 250 is reduced, the etching in the first epitaxial layer 210 continues, such that the mismatch of the etching depths D1 and D2 in the substrate 110 may be reduced.

In some embodiments, the etching process forms first trenches 113 in the N-wells 112 and forms second trenches 115 in the P-well 114. Each of the first trenches 113 has a depth D1, and each of the second trenches 115 has a depth D2. In some embodiments, the depth D1 is substantially the same as the depth D2. In some other embodiments, the difference between the depths D1 and D2 is less than about 10 nm. If the difference between the depths D1 and D2 is greater than about 20 nm, the well-implant efficiency may be reduced. The depth D1 may be greater than or less than the depth D2.

After the etching process, the first semiconductor fins 215 are formed above the N-type regions 110n of the substrate 110, and the second semiconductor fins 255 are formed above the P-type region 110p of the substrate 110. Each of the first semiconductor fins 215 has a top portion 215t and a bottom portion 215b. The top portion 215t is patterned from the first epitaxial layer 210, and the bottom portion 215b is patterned from the N-well 110n of the substrate 110. Each of the second semiconductor fins 255 has a top portion 255t and a bottom portion 255b. The top portion 255t is patterned from the second epitaxial layer 250, and the bottom portion 255b is patterned from the P-well 110p of the substrate 110. Further, for each of the second semiconductor fins 255, the top portion 255t of the second semiconductor fin 255 has the neck part 256 (mentioned above) in contact with the bottom portion 255b of the semiconductor fin 255, and the spacer structures 240 are on opposite sides of the neck part 256.

Figure 10A:
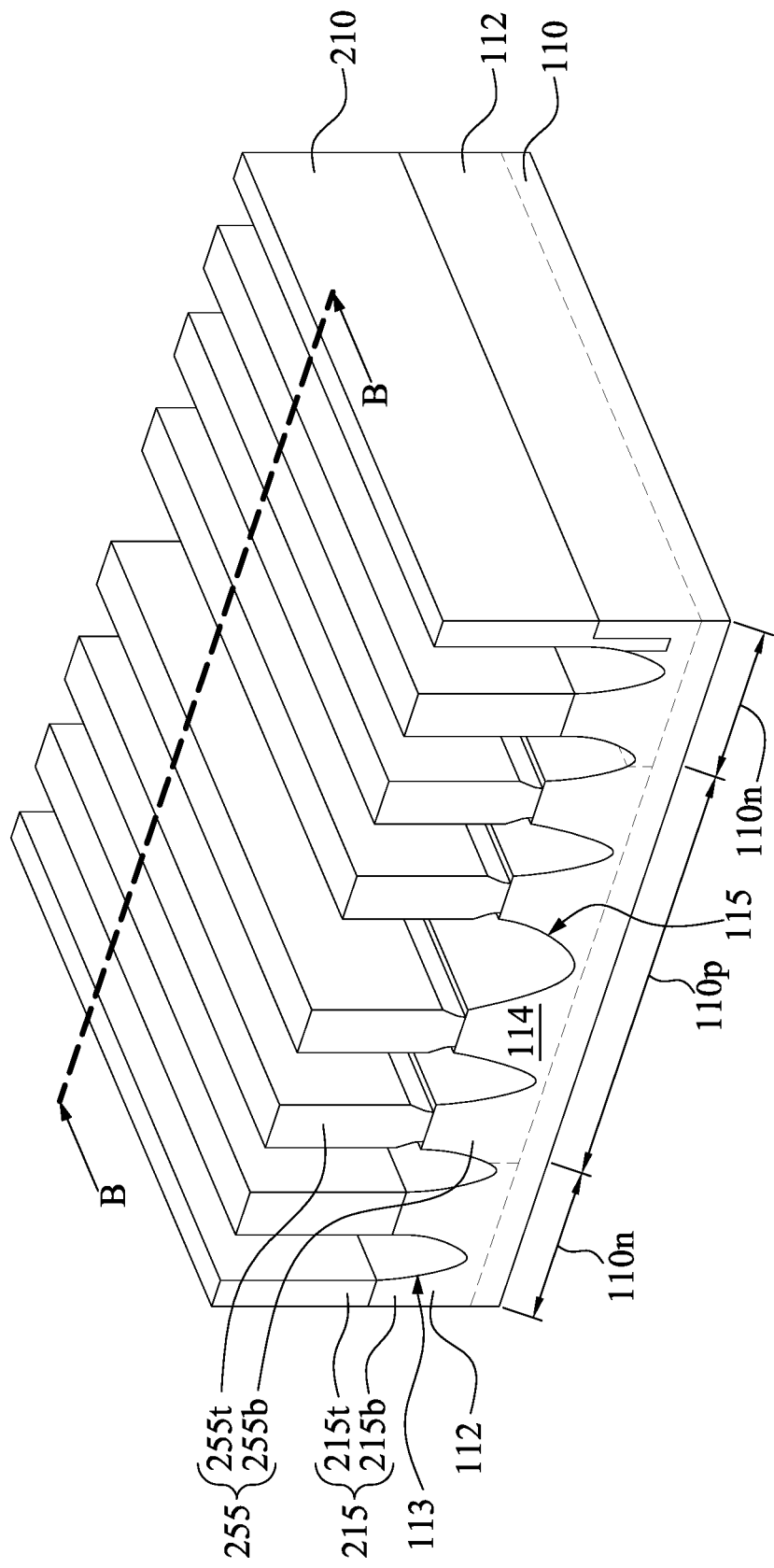
Figure 10B:
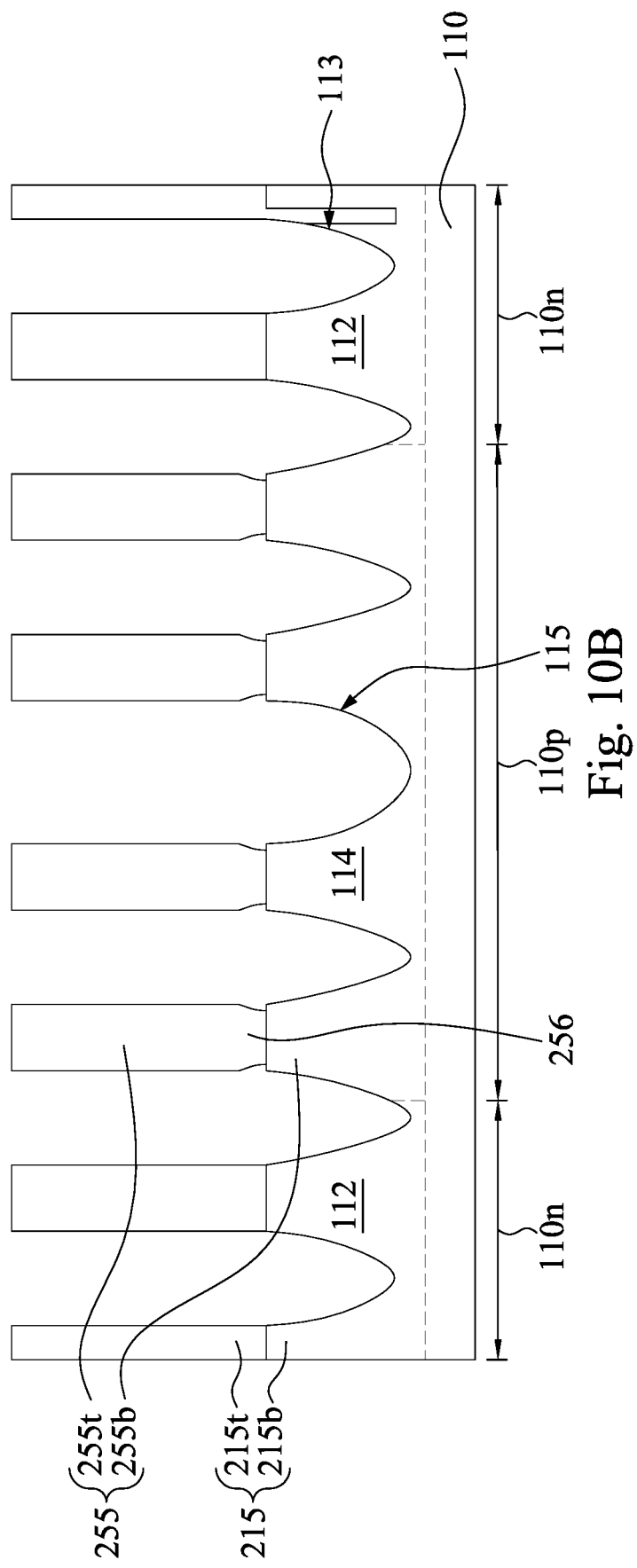

Reference is made to FIGS. 10A and 10B, where FIG. 10B is a cross-sectional view taken along line B-B in FIG. 10A. The first semiconductor fins 215 and the second semiconductor fins 255 are trimmed to reduce their widths. In this process, the spacer structures 240 (see FIGS. 9A and 9B) (and the remaining mask portions 230a in FIGS. 9A and 9B) are also removed. In some embodiments, the trimming process may be an etching process, e.g., a wet etching process. After the trimming process, the sidewalls of the neck parts 256 of the second semiconductor fins 255 are exposed.

Figure 11A:
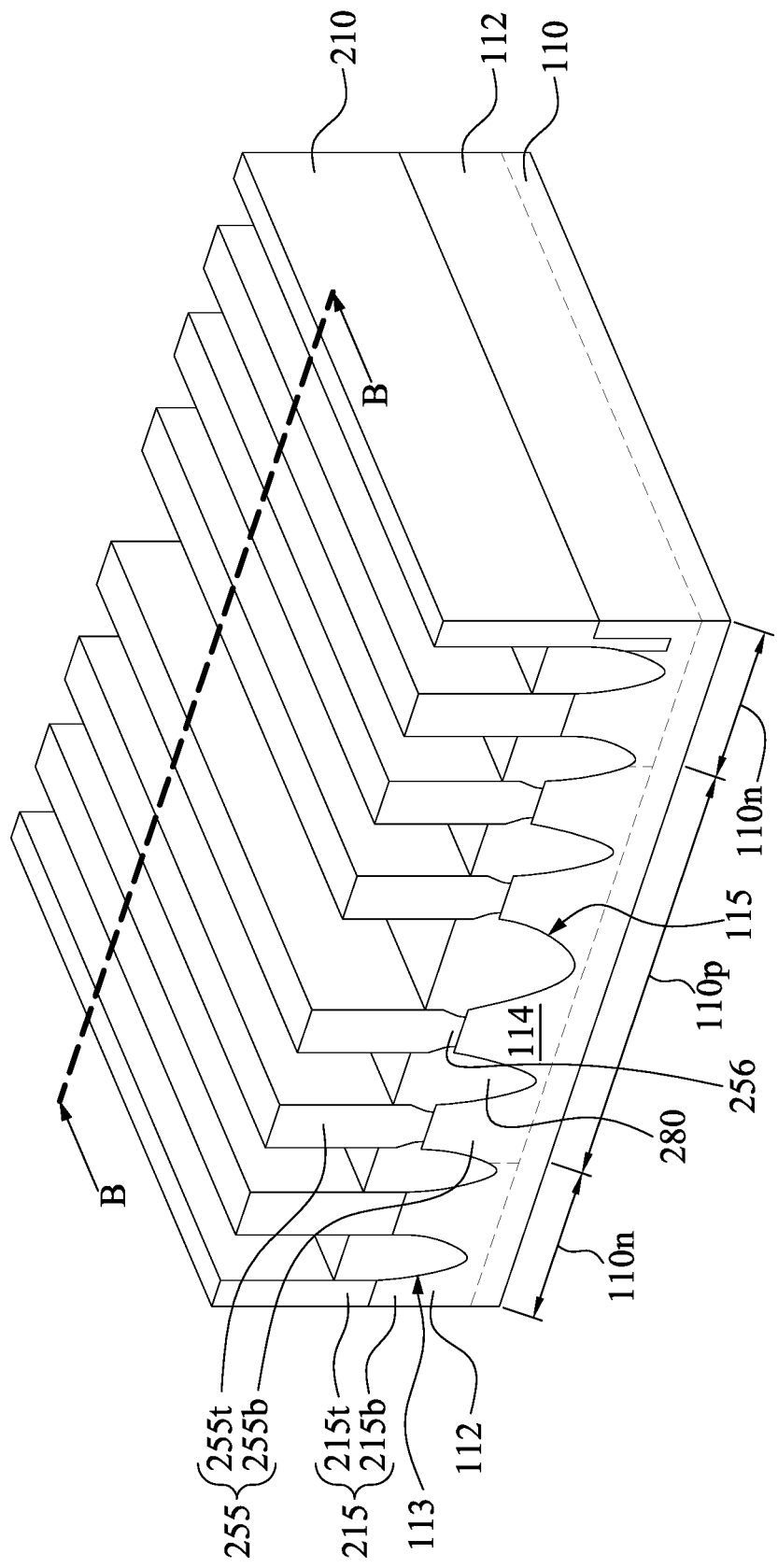
Figure 11B:
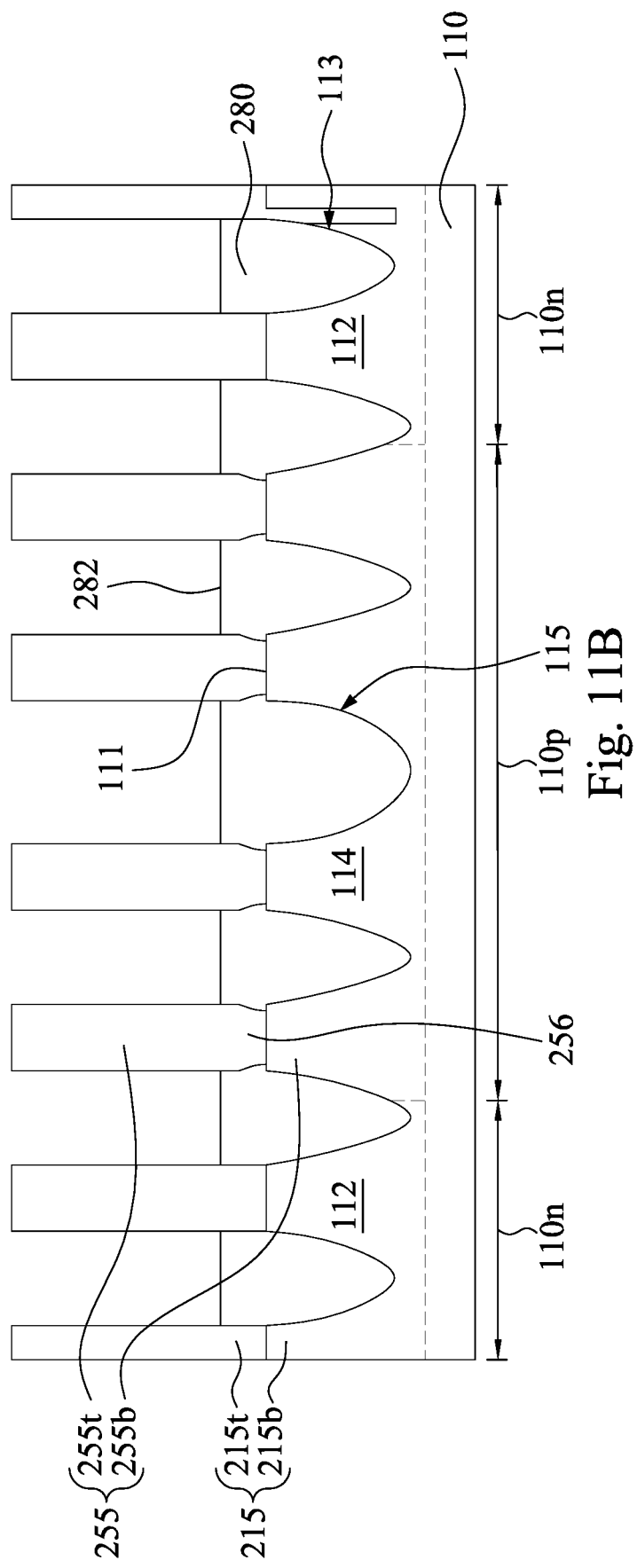

Reference is made to FIGS. 11A and 11B, where FIG. 11B is a cross-sectional view taken along line B-B in FIG. 11A. Isolation structures 280, such as shallow trench isolation (STI) structures, are formed in the first trenches 113 and the second trenches 115 to separate various devices. The formation of the isolation structures 280 may include filling the first trenches 113 and the second trenches 115 by insulator materials such as silicon oxide, silicon nitride, or silicon oxynitride. The filled first trenches 113 and the second trenches 115 may have a multi-layer structure such as a thermal oxide liner layer with silicon nitride filling the trench. In some embodiments, the isolation structures 280 may be created using a process sequence involving, for example, optionally growing a thermal oxide trench liner to improve the trench interface, filling the trench with CVD oxide, using chemical mechanical planarization (CMP) to remove the excessive dielectric layers, and reducing the height of the dielectric layers. In FIG. 11B, top surfaces 282 of the isolation structures 280 are higher than the top surface 111 of the substrate 110. That is, the isolation structures 280 are in contact with the neck parts 256 of the second semiconductor fins 255. With such a configuration, the isolation structures 280 prevent the top portions 255t of the second semiconductor fins 255 from collapsing.

Figure 12A:
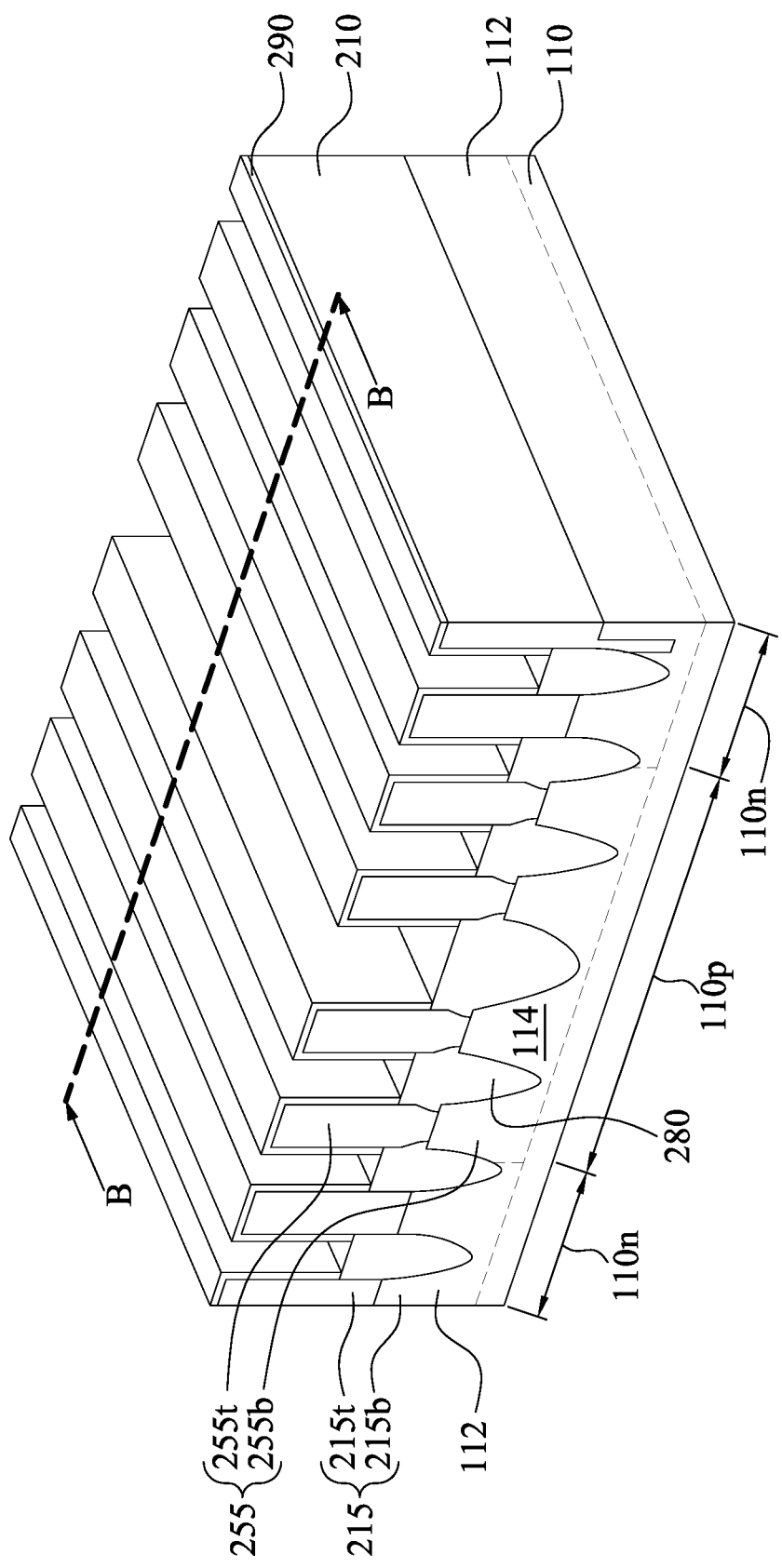
Figure 12B:
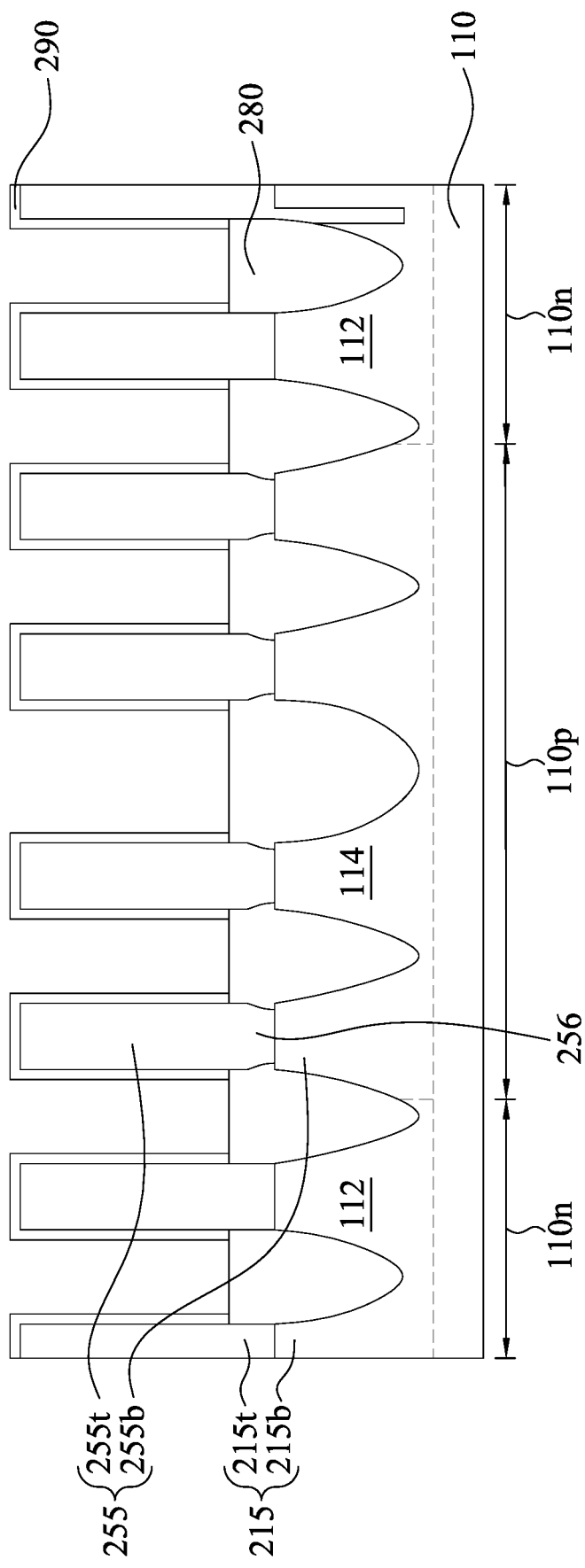

Reference is made to FIGS. 12A and 12B, where FIG. 12B is a cross-sectional view taken along line B-B in FIG. 12A. Cap layers 290 are respectively formed above the first semiconductor fins 215 and the second semiconductor fins 255. The cap layers 290 extend on, and contact, the top surfaces and sidewalls of the first semiconductor fins 215 and the second semiconductor fins 255. The cap layers 290 protect the first semiconductor fins 215 and the second semiconductor fins 255 from damage in subsequent processing. The cap layers 290 may be formed on both the first semiconductor fins 215 and the second semiconductor fins 255, or on the second semiconductor fins 255 but not on the first semiconductor fins 215. In some embodiments, the cap layers 290 are amorphous silicon layers deposited by CVD. The cap layers 290 are spaced apart from the neck parts 256 of the second semiconductor fins 255.

Figure 13A:
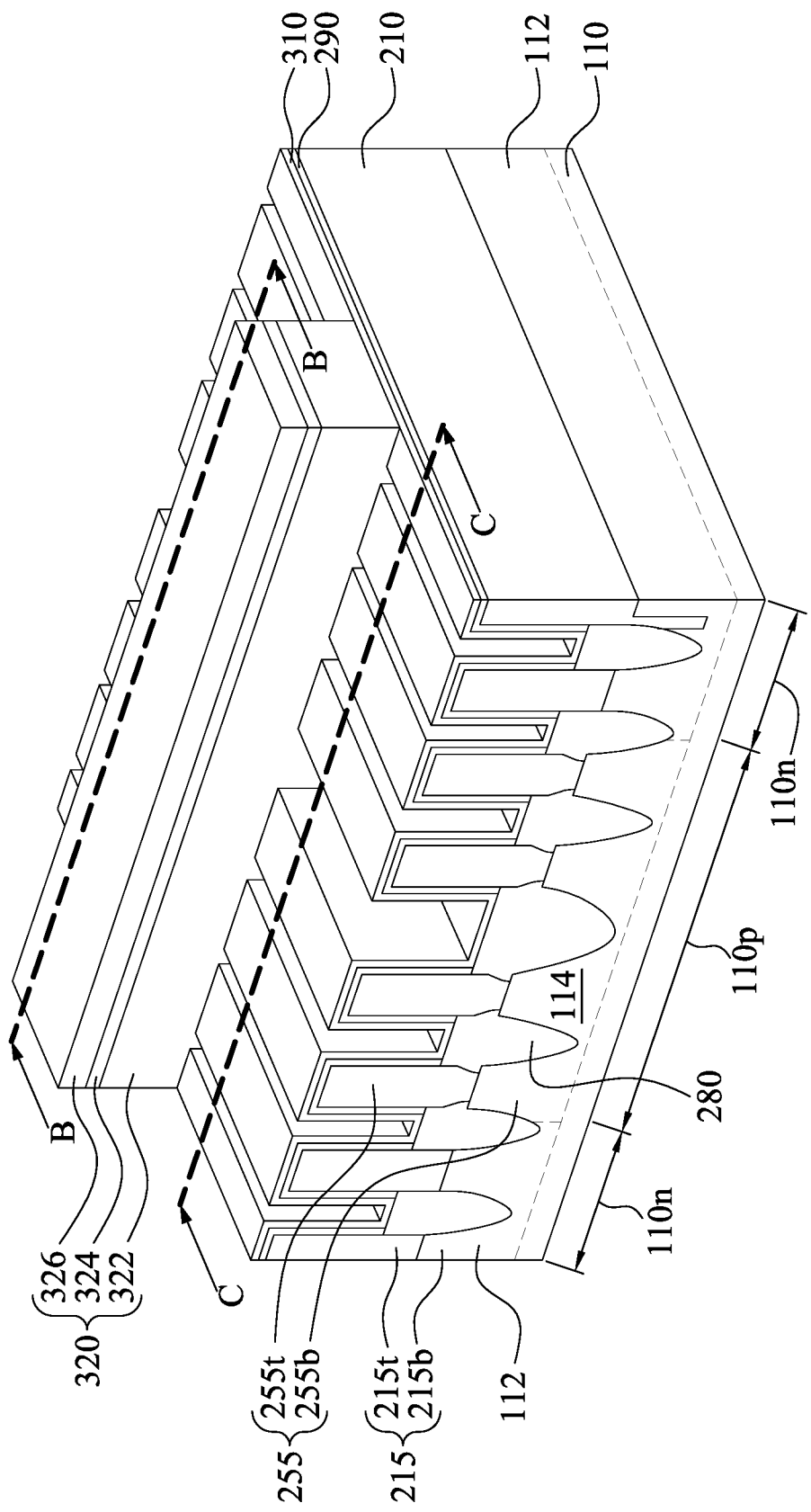
Figure 13B:
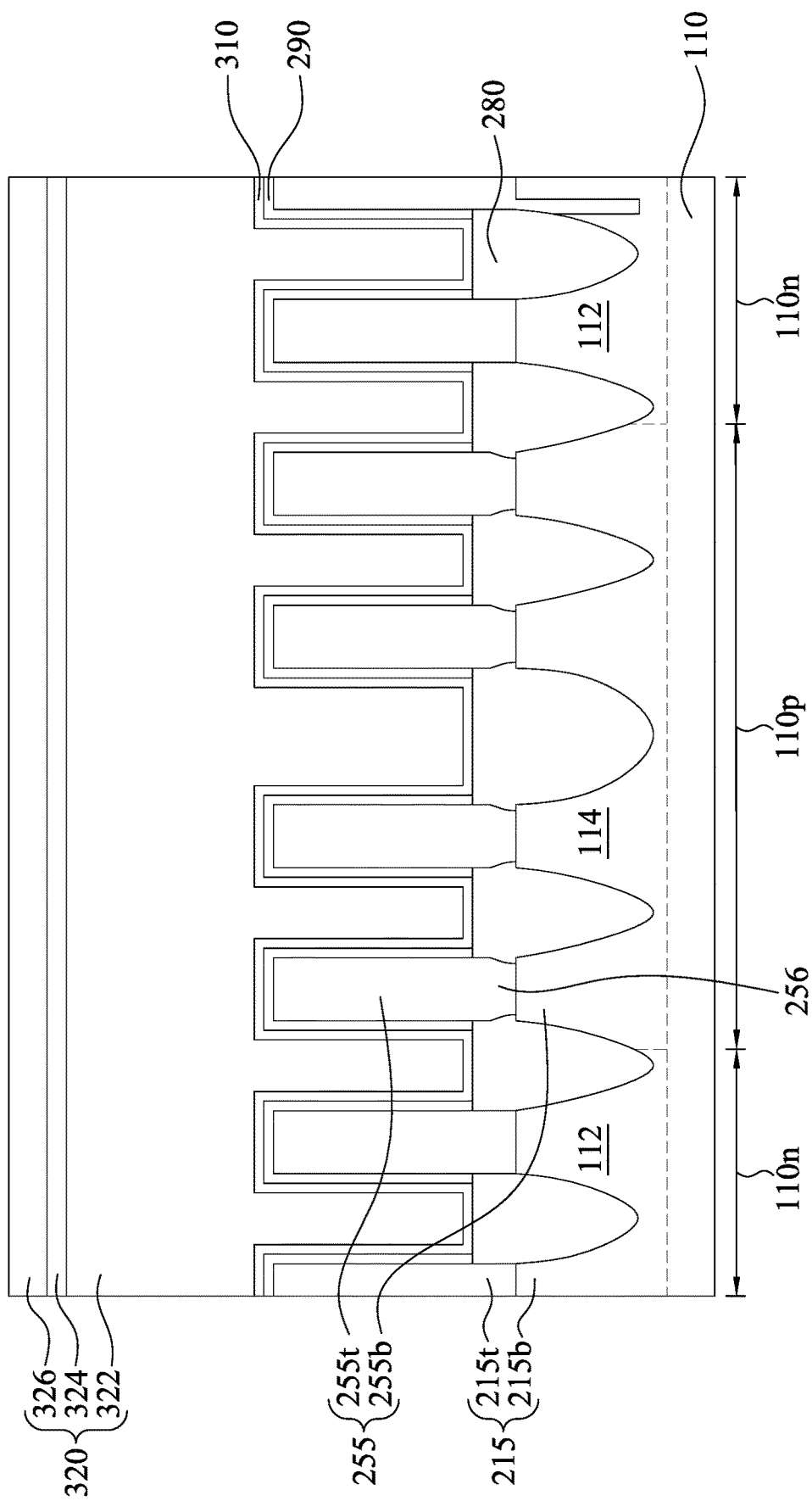
Figure 13C:
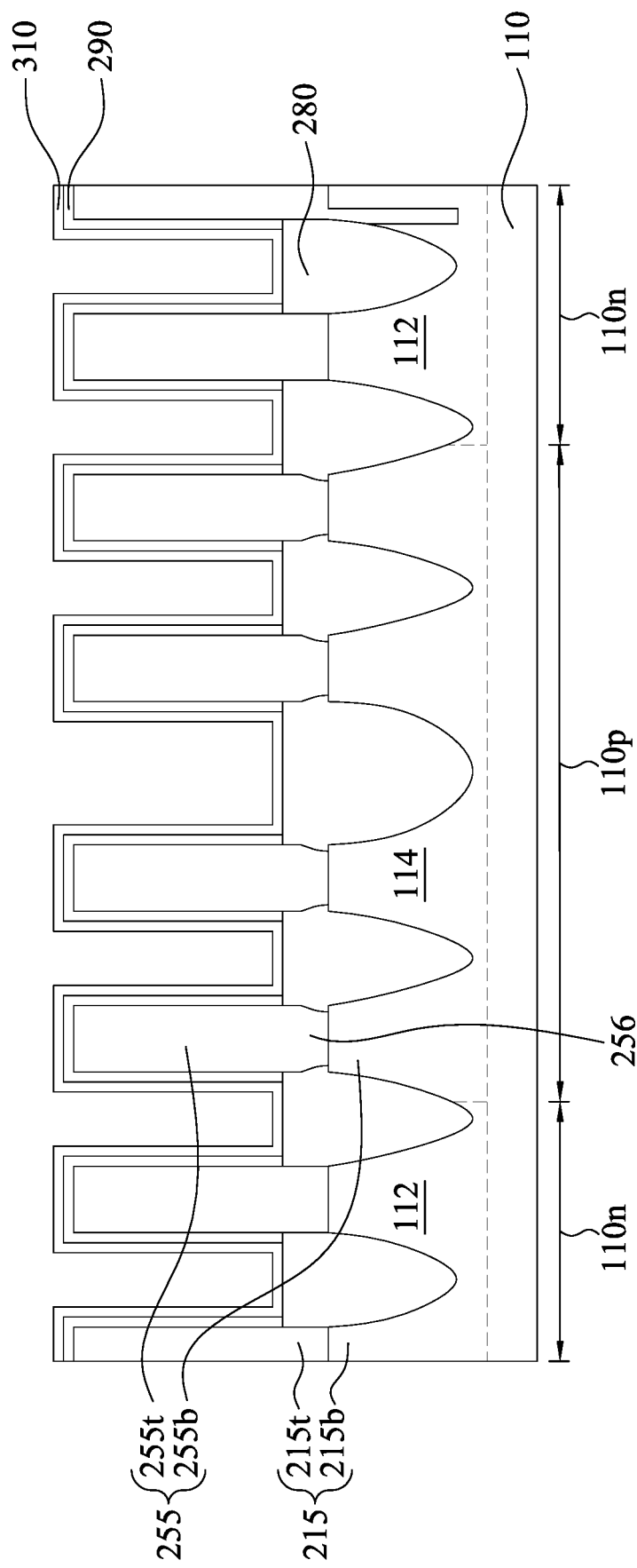

Reference is made to FIGS. 13A, 13B, and 13C, where FIG. 13B is a cross-sectional view taken along line B-B in FIG. 13A, and FIG. 13C is a cross-sectional view taken along line C-C in FIG. 13A. A dummy dielectric layer 310 is conformally formed to cover the first semiconductor fins 215, the second semiconductor fins 255, and the isolation structures 280. In some embodiments, the dummy dielectric layer 310 may include silicon dioxide, silicon nitride, a high-κ dielectric material or other suitable materials. In various examples, the dummy dielectric layer 130 may be deposited by an ALD process, a CVD process, a subatmospheric CVD (SACVD) process, a flowable CVD process, a PVD process, or another suitable process. By way of example, the dummy dielectric layer 310 may be used to prevent damage to the first semiconductor fins 215 and the second semiconductor fins 255 by subsequent processing (e.g., subsequent formation of the dummy gate structure).

Subsequently, at least one dummy gate stack 320 is formed above the dummy dielectric layer 310, the first semiconductor fins 215, and the second semiconductor fins 255. The dummy gate stack 320 includes a dummy gate electrode 322, a pad layer 324 formed over the dummy gate electrode 322, and a hard mask layer 326 formed over the pad layer 324. In some embodiments, a dummy gate layer (not shown) may be formed over the dummy dielectric layer 310, and the pad layer 324 and the hard mask layer 326 are formed over the dummy gate layer. The dummy gate layer is then patterned using the pad layer 324 and the hard mask layer 326 as masks to form the dummy gate electrode 322. The dummy gate electrode 322, the pad layer 324, and the hard mask layer 326 are referred to as the dummy gate stack 320. In some embodiments, the dummy gate electrode 322 may be made of polycrystalline-silicon (poly-Si), polycrystalline silicon-germanium (poly-SiGe), or other suitable materials. The pad layer 324 may be made of silicon dioxide or other suitable materials, and the hard mask layer 326 may be made of silicon nitride or other suitable materials.

Figure 14A:
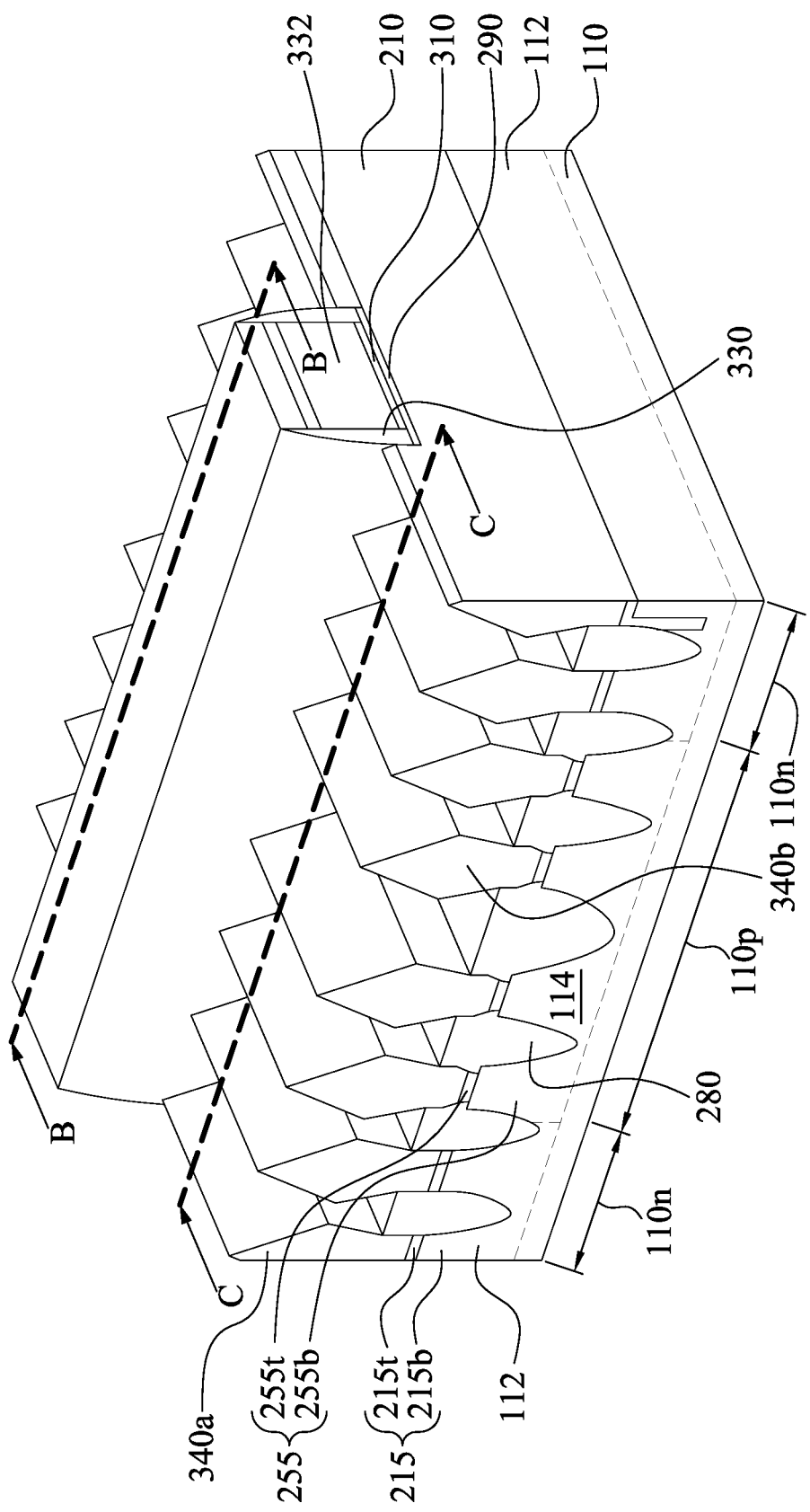
Figure 14B:
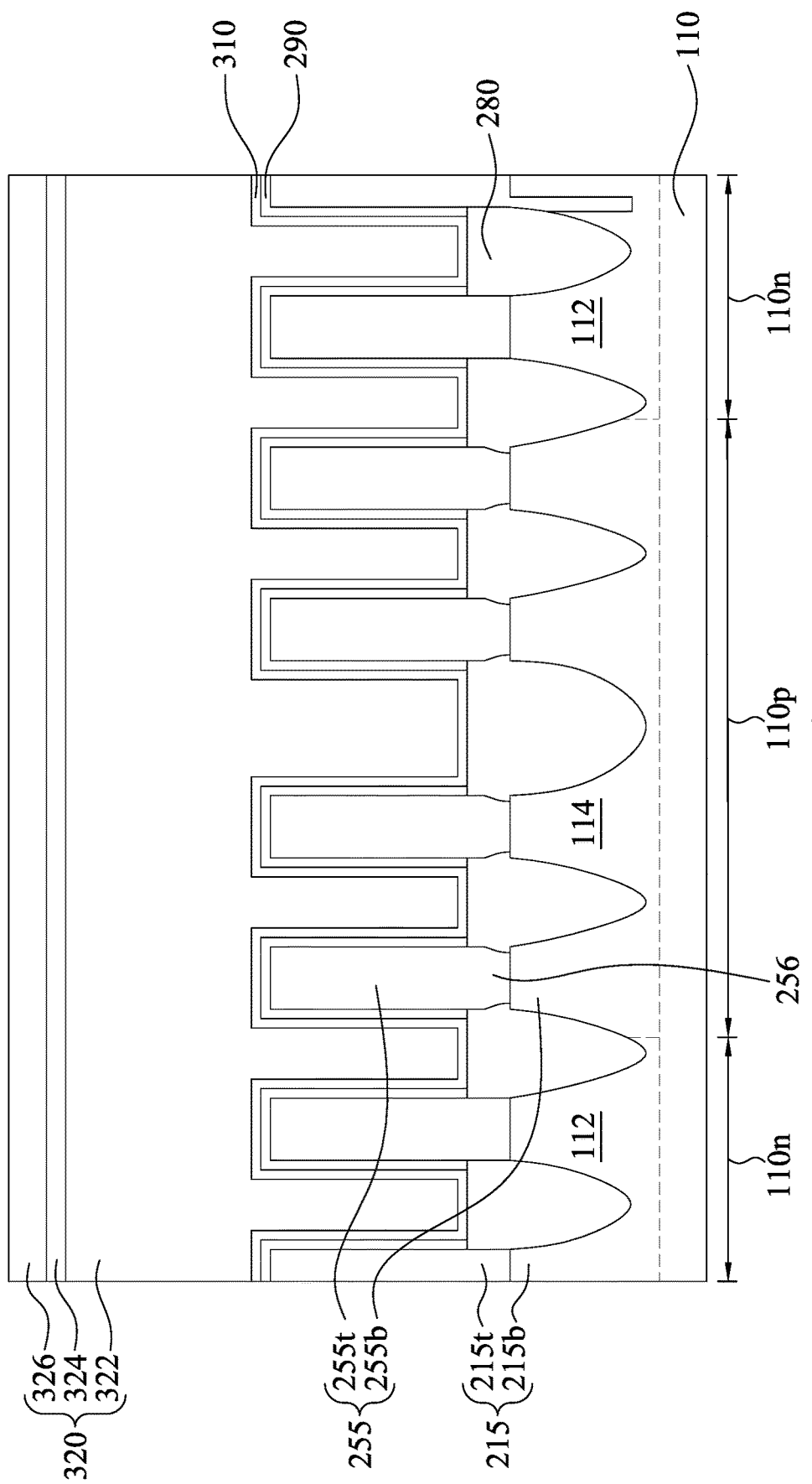
Figure 14C:
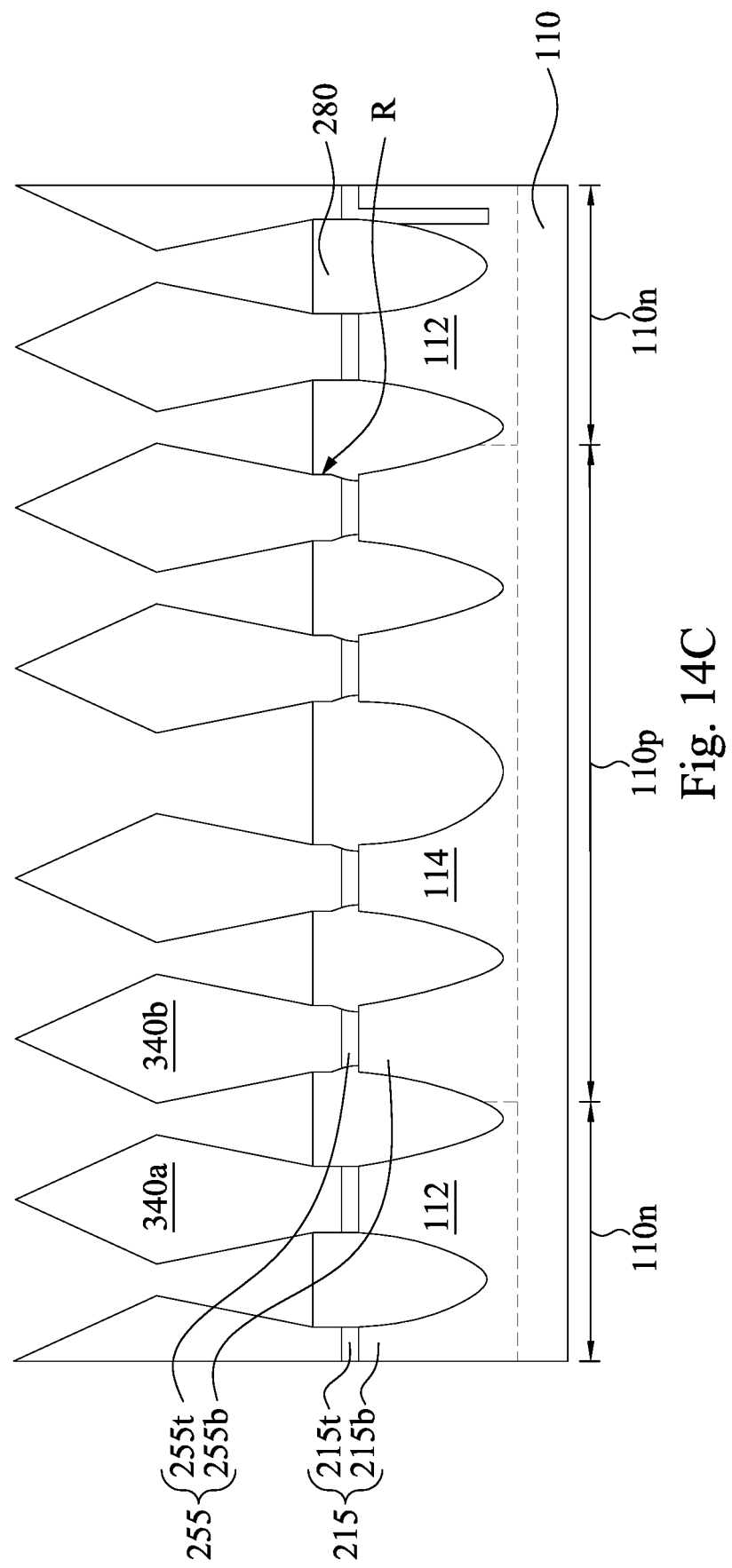

Reference is made to FIGS. 14A, 14B, and 14C, where FIG. 14B is a cross-sectional view taken along line B-B in FIG. 14A, and FIG. 14C is a cross-sectional view taken along line C-C in FIG. 14A. Portions of the dummy dielectric layer 310 uncovered by the dummy gate stack 320 are removed to expose the cap layers 290. Gate spacer structures 330 are then formed at least on opposite sides of the dummy gate stack 320. The gate spacer structures 330 may include a seal spacer and a main spacer (not shown). The gate spacer structures 330 include one or more dielectric materials, such as silicon oxide, silicon nitride, silicon oxynitride, SiCN, $SiC_xO_yN_z$, or combinations thereof. The seal spacers are formed on sidewalls of the dummy gate stack 320 and the main spacers are formed on the seal spacers. The gate spacer structures 330 can be formed using a deposition method, such as plasma enhanced chemical vapor deposition (PECVD), low-pressure chemical vapor deposition (LPCVD), sub-atmospheric chemical vapor deposition (SACVD), or the like. The formation of the gate spacer structures 330 may include blanket forming spacer layers and then performing etching operations to remove the horizontal portions of the spacer layers. The remaining vertical portions of the spacer layers form the gate spacer structures 330.

A plurality of recesses R are formed in the first semiconductor fins 215 and the second semiconductor fins 255 by etching the first semiconductor fins 215 and the second semiconductor fins 255. The dummy gate stack 320 and the gate spacer structures 330 act as etching masks in the formation of the recesses R. The etching process includes a dry etching process, a wet etching process, or combinations thereof. For example, the etching process utilizes a combination of dry and wet etching. The etching process may involve a single-etching operation or may include a plurality of etching operations.

Next, a semiconductor material is deposited in the recesses R to form epitaxial structures 340a and 340b which are referred to as source/drain features. The epitaxial structures 340a and 340b are formed by epitaxially growing a semiconductor material. The semiconductor material includes a single element semiconductor material, such as germanium (Ge) or silicon (Si), compound semiconductor materials, such as gallium arsenide (GaAs) or aluminum gallium arsenide (AlGaAs), or a semiconductor alloy, such as silicon germanium (SiGe) or gallium arsenide phosphide (GaAsP). The epitaxial structures 340a and 340b have suitable crystallographic orientations (e.g., a (100), (110), or (111) crystallographic orientation). In some embodiments, the epitaxial structures 340a and 340b include source/drain epitaxial structures. In some embodiments, where an N-type device is desired, the epitaxial structures 340a may include an epitaxially grown silicon phosphorus (SiP) or silicon carbon (SiC). In some embodiments, where a P-type device is desired, the epitaxial structures 340b may include an epitaxially grown silicon germanium (SiGe). The epitaxial processes include CVD deposition techniques (e.g., vapor-phase epitaxy (VPE) and/or ultra-high vacuum CVD (UHV-CVD)), molecular beam epitaxy, and/or other suitable processes.

Figure 15A:
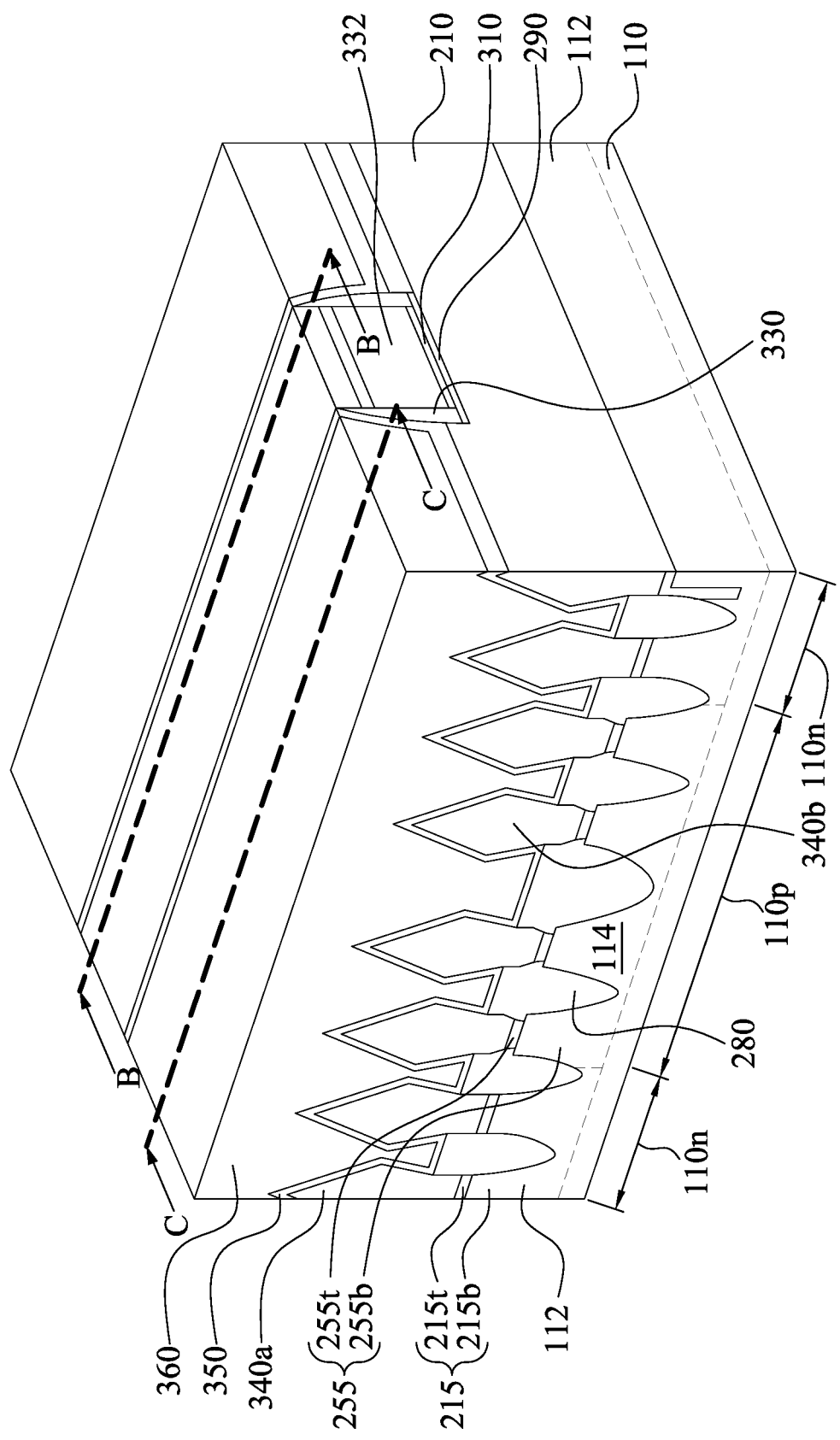
Figure 15B:
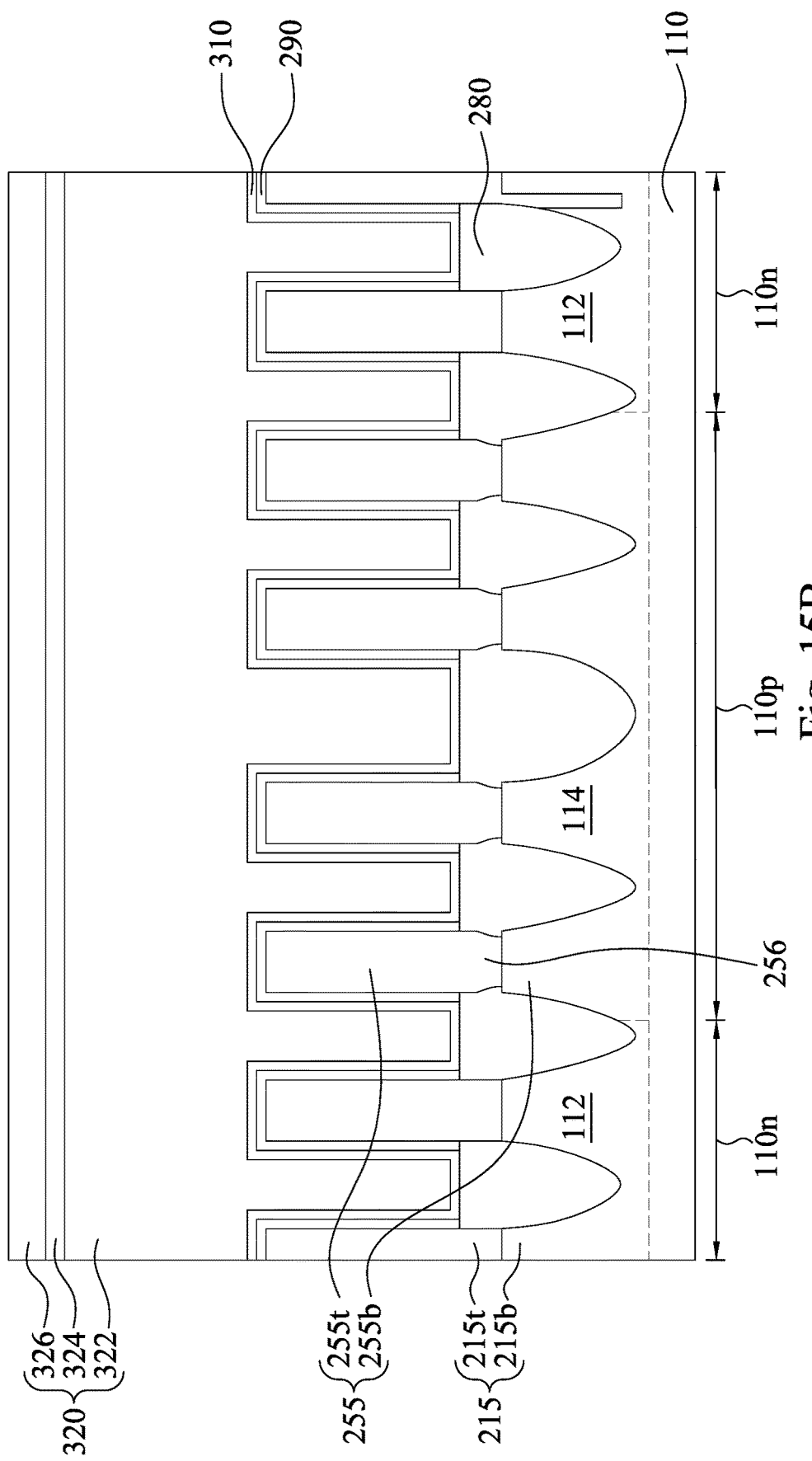
Figure 15C:
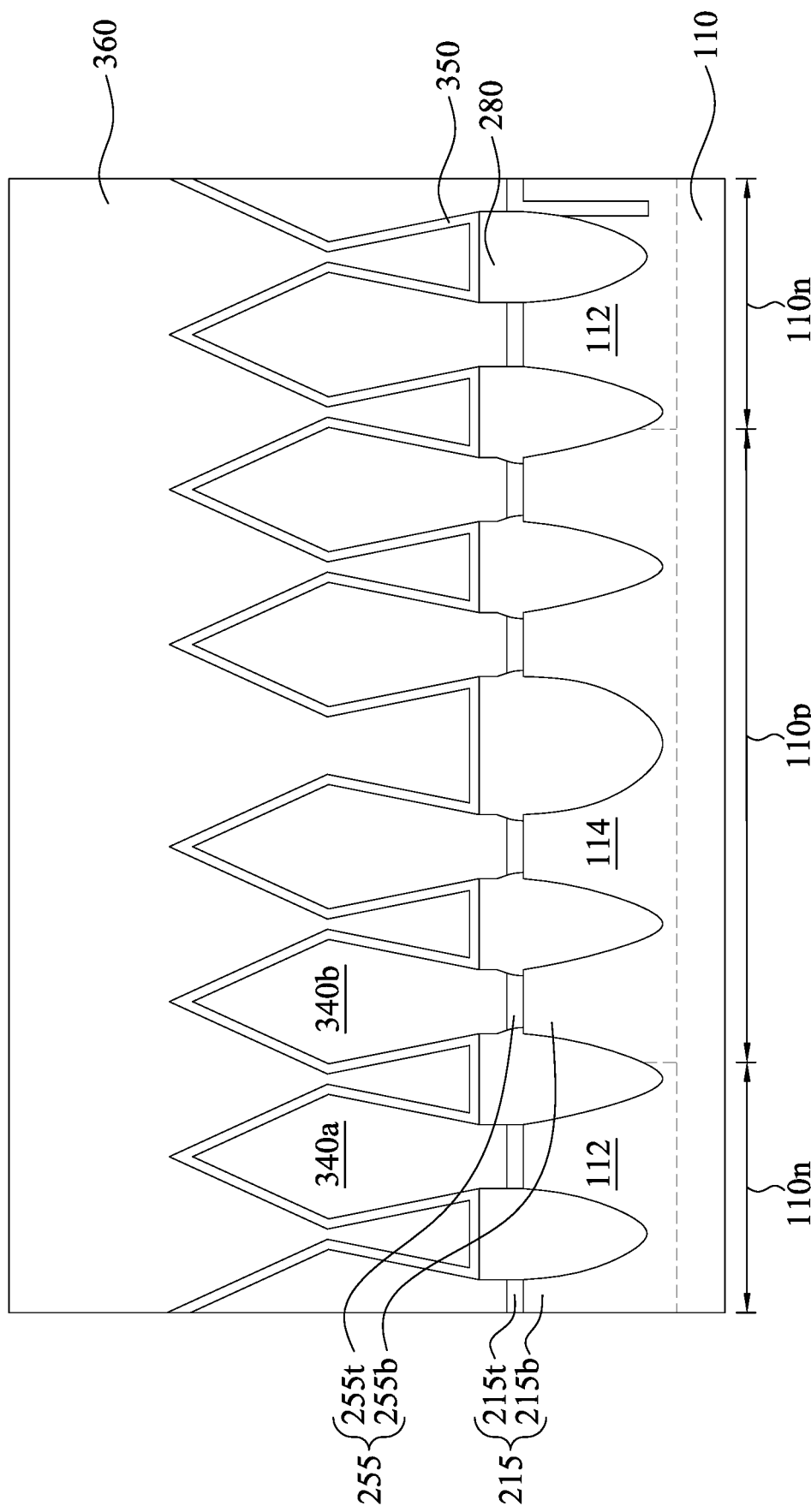

Reference is made to FIGS. 15A, 15B, and 15C, where FIG. 15B is a cross-sectional view taken along line B-B in FIG. 15A, and FIG. 15C is a cross-sectional view taken along line C-C in FIG. 15A. A contact etch stop layer (CESL) 350 is conformally formed over the structure of FIG. 14A. In some embodiments, the CESL 350 can be a stressed layer or layers. In some embodiments, the CESL 350 has a tensile stress and is formed of $Si_3N_4$. In some other embodiments, the CESL 350 includes materials such as oxynitrides. In yet some other embodiments, the CESL 350 may have a composite structure including a plurality of layers, such as a silicon nitride layer overlying a silicon oxide layer. The CESL 350 can be formed using plasma enhanced CVD (PECVD), however, other suitable methods, such as low pressure CVD (LPCVD), atomic layer deposition (ALD), and the like, can also be used.

A first interlayer dielectric (ILD) 360 is then formed on the CESL 350. The first ILD 360 may be formed by chemical vapor deposition (CVD), high-density plasma CVD, spin-on, sputtering, or other suitable methods. In some embodiments, the first ILD 360 includes silicon oxide. In some other embodiments, the first ILD 360 may include silicon oxy-nitride, silicon nitride, or a low-k material.

Figure 16A:
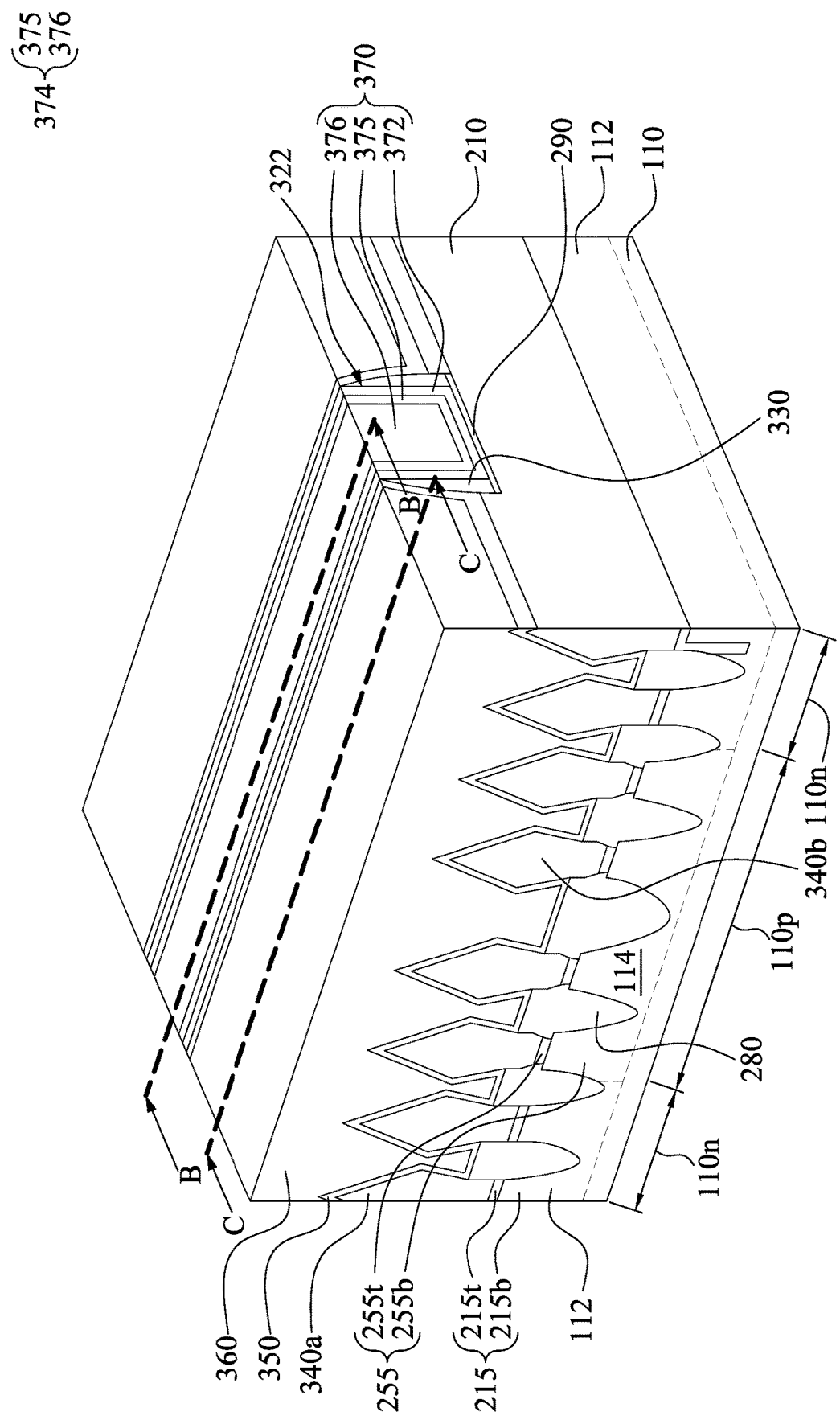
Figure 16B:
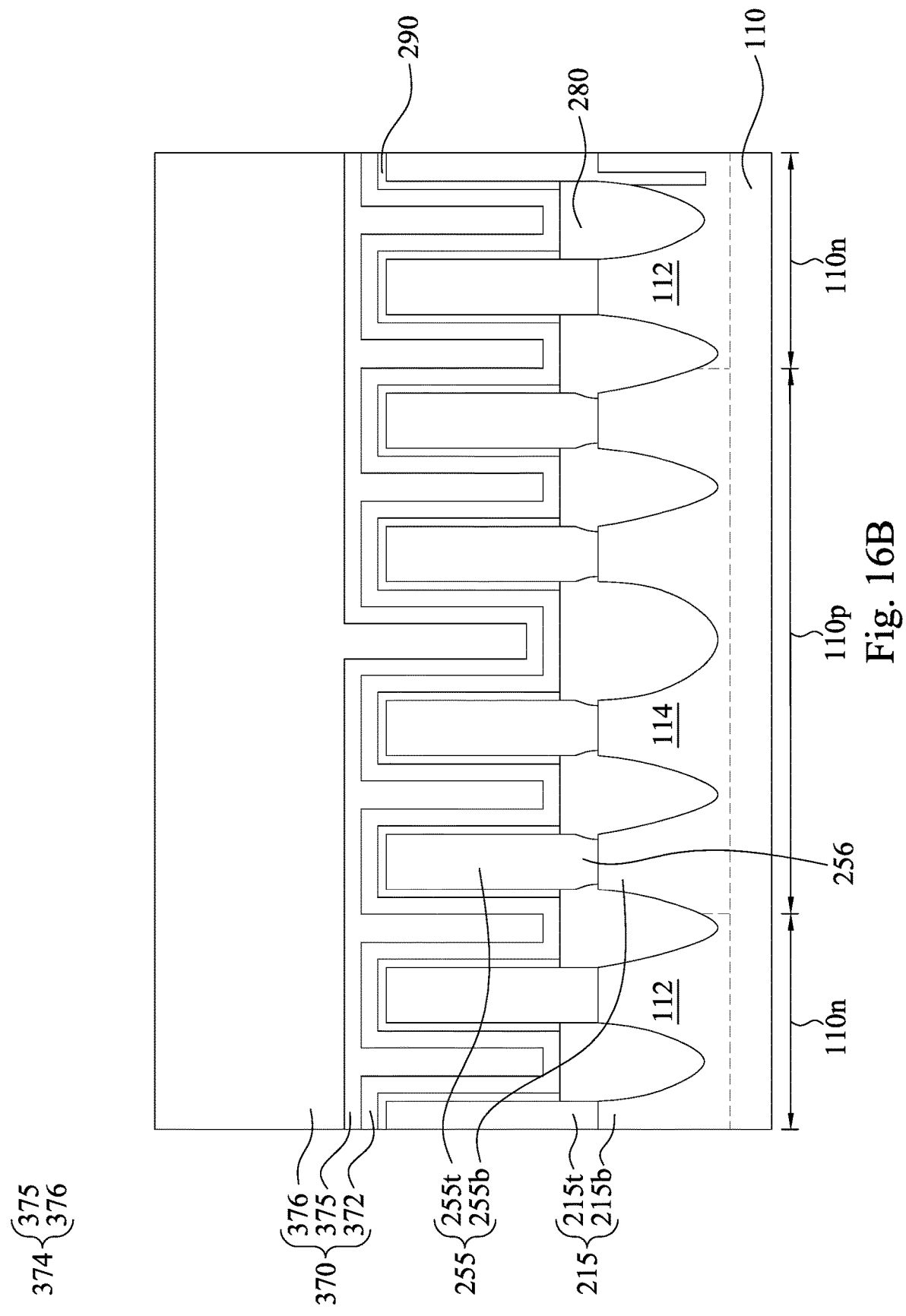
Figure 16C:
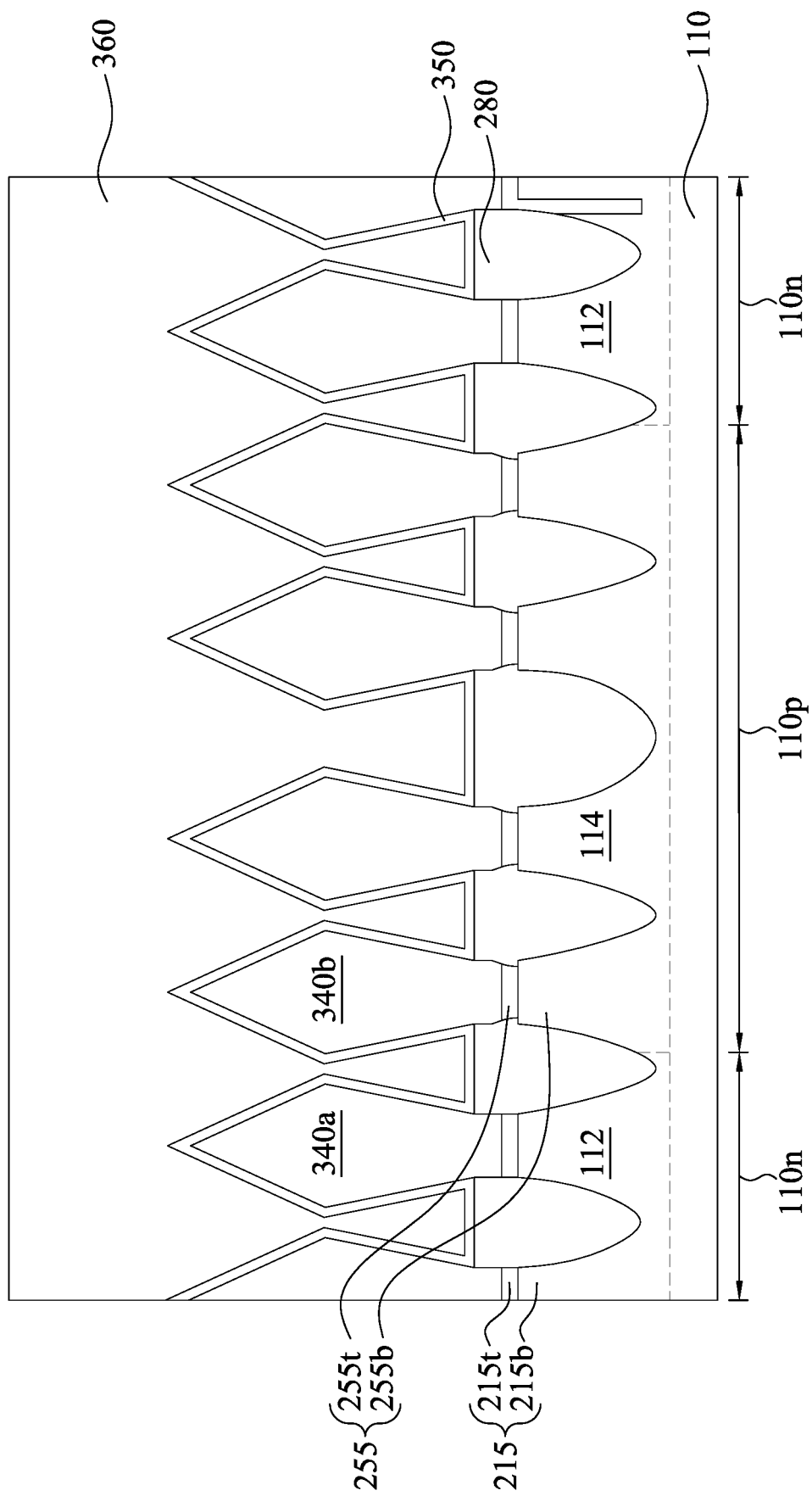

Reference is made to FIGS. 16A, 16B, and 16C, where FIG. 16B is a cross-sectional view taken along line B-B in FIG. 16A, and FIG. 16C is a cross-sectional view taken along line C-C in FIG. 16A. A replacement gate (RPG) process scheme is employed. In the RPG process scheme, a dummy polysilicon gate (the dummy gate stack 320 of FIGS. 15A and 15B in this case) is formed in advance and is replaced later by a metal gate. In some embodiments, the dummy gate stack 320 is removed to form an opening 322 with the gate spacer structures 330 as its sidewalls. In some other embodiments, the dummy dielectric layers 310 (see FIGS. 15A and 15B) are removed as well. The dummy gate stack 320 (and the dummy dielectric layers 310) may be removed by dry etching, wet etching, or a combination of dry and wet etching. For example, a wet etch process may include exposure to a hydroxide containing solution (e.g., ammonium hydroxide), deionized water, and/or other suitable etchant solutions.

A gate dielectric layer 372 is formed in the opening 322, and at least one metal layer is formed in the opening 322 and on the gate dielectric layer 372. Subsequently, a chemical mechanical planarization (CMP) process is performed to planarize the metal layer and the gate dielectric layer 372 to form a metal gate structure 370 in the opening 322. The metal gate structure 370 crosses over the first semiconductor fins 215 and/or the second semiconductor fins 255. The metal gate structure 370 includes the gate dielectric layer 372 and a metal gate electrode 374 over the gate dielectric layer 372. The metal gate electrode 374 may include metal layers 375, e.g., work function metal layer(s) and capping layer(s), a fill layer(s) 376, and/or other suitable layers that are desirable in a metal gate stack. The work function metal layer may include an n-type and/or a p-type work function metal. Exemplary n-type work function metals 375 include Ti, Ag, TaAl, TaAlC, TiAlN, TaC, TaCN, TaSiN, Mn, Zr, other suitable n-type work function materials, or combinations thereof. Exemplary p-type work function metals 375 include TiN, TaN, Ru, Mo, Al, WN, $ZrSi_2$, $MoSi_2$, $TaSi_2$, $NiSi_2$, WN, other suitable p-type work function materials, or combinations thereof. The work function metal layer may have multiple layers. The work function metal layer(s) may be deposited by CVD, PVD, electroplating and/or other suitable processes. In some embodiments, the metal gate electrode is a p-type metal gate including a p-type work function metal layer. In some embodiments, the capping layer in the metal gate electrodes may include refractory metals and their nitrides (e.g., TiN, TaN, $W_2N$, TiSiN, and TaSiN). The capping layer may be deposited by PVD, CVD, metal-organic chemical vapor deposition (MOCVD) ALD, or the like. In some embodiments, the fill layer 376 in the metal gate electrodes may include tungsten (W). The fill layer 376 may be deposited by ALD, PVD, CVD, or another suitable process.

Figure 17A:
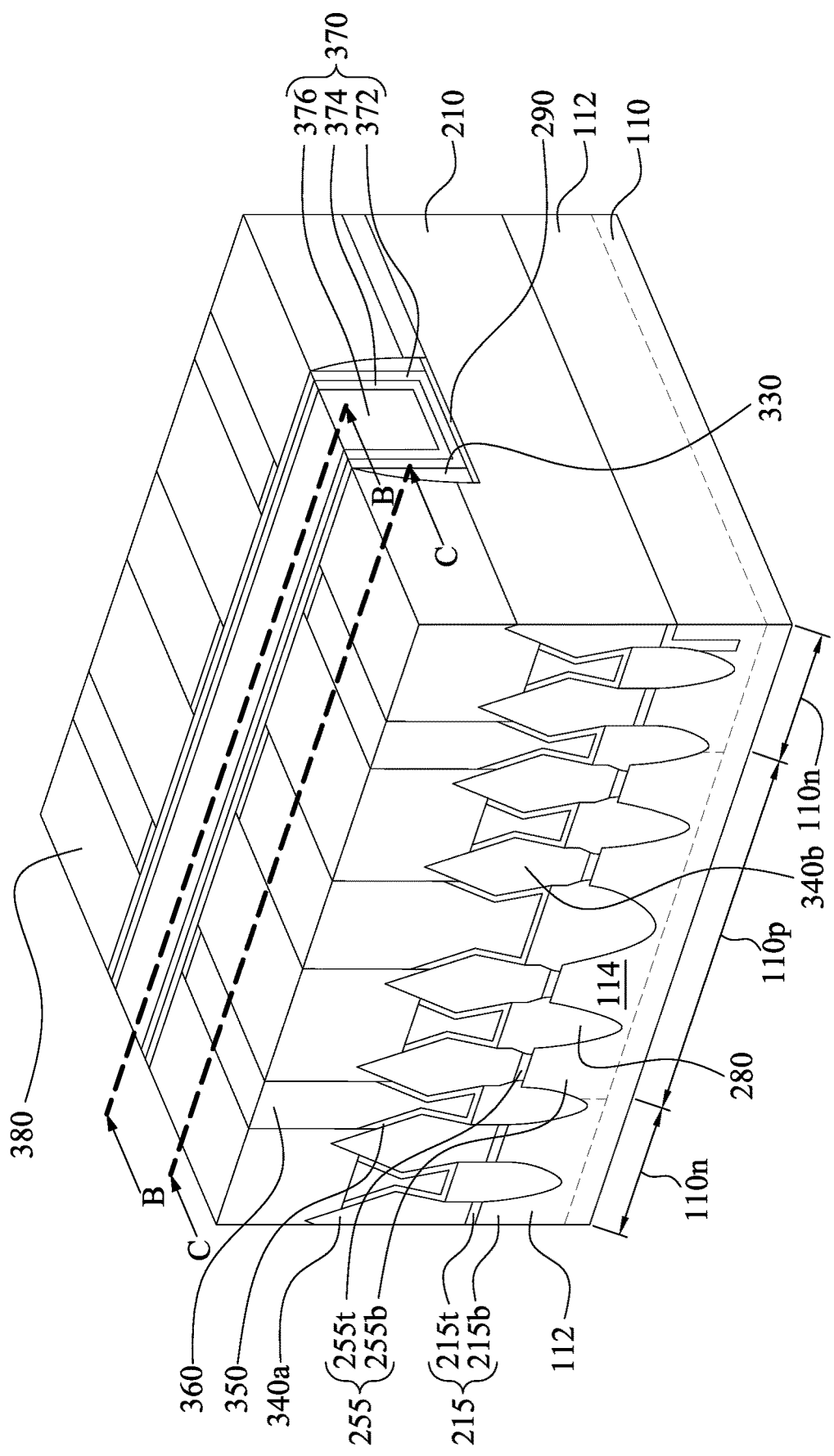
Figure 17B:
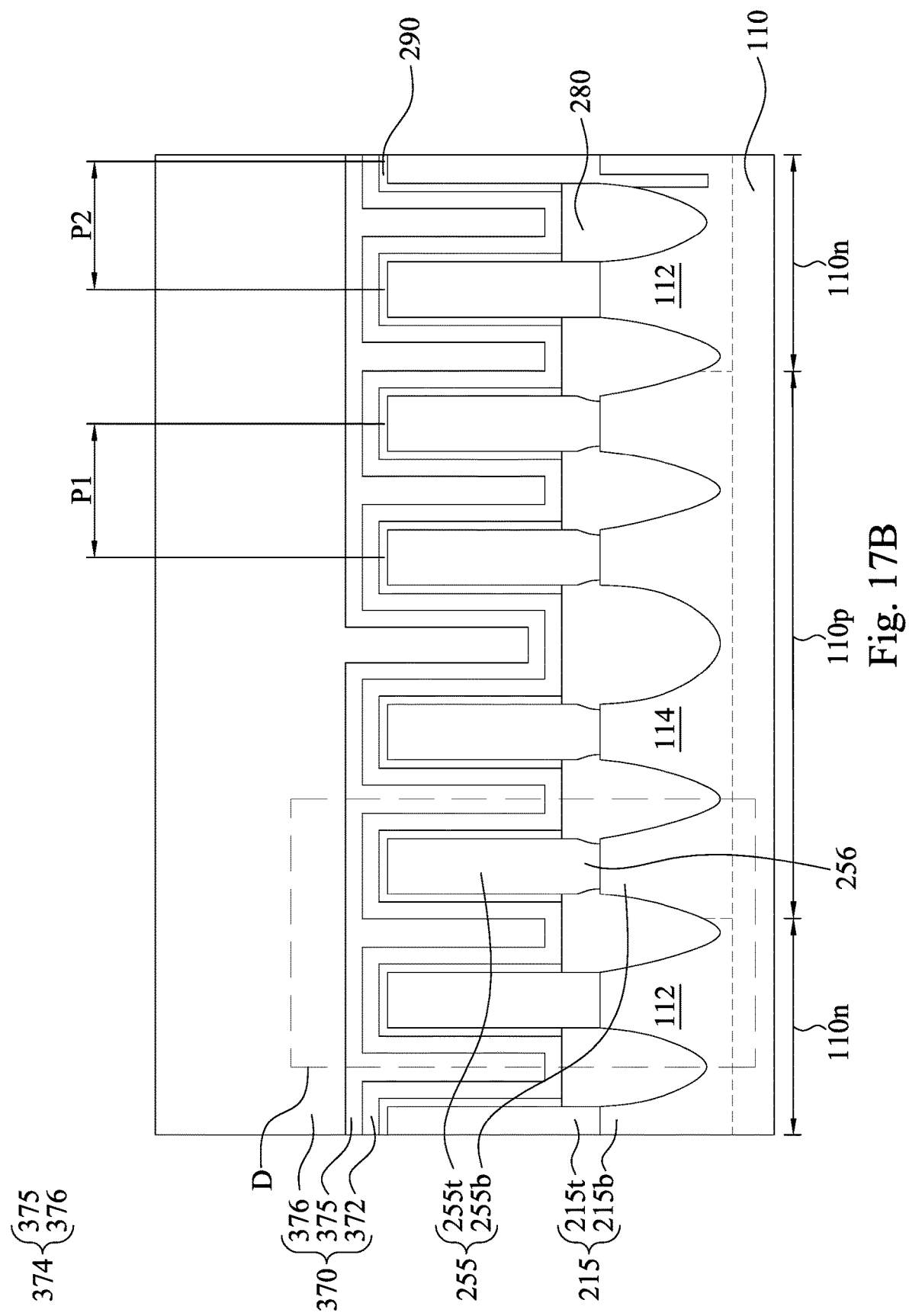
Figure 17C:
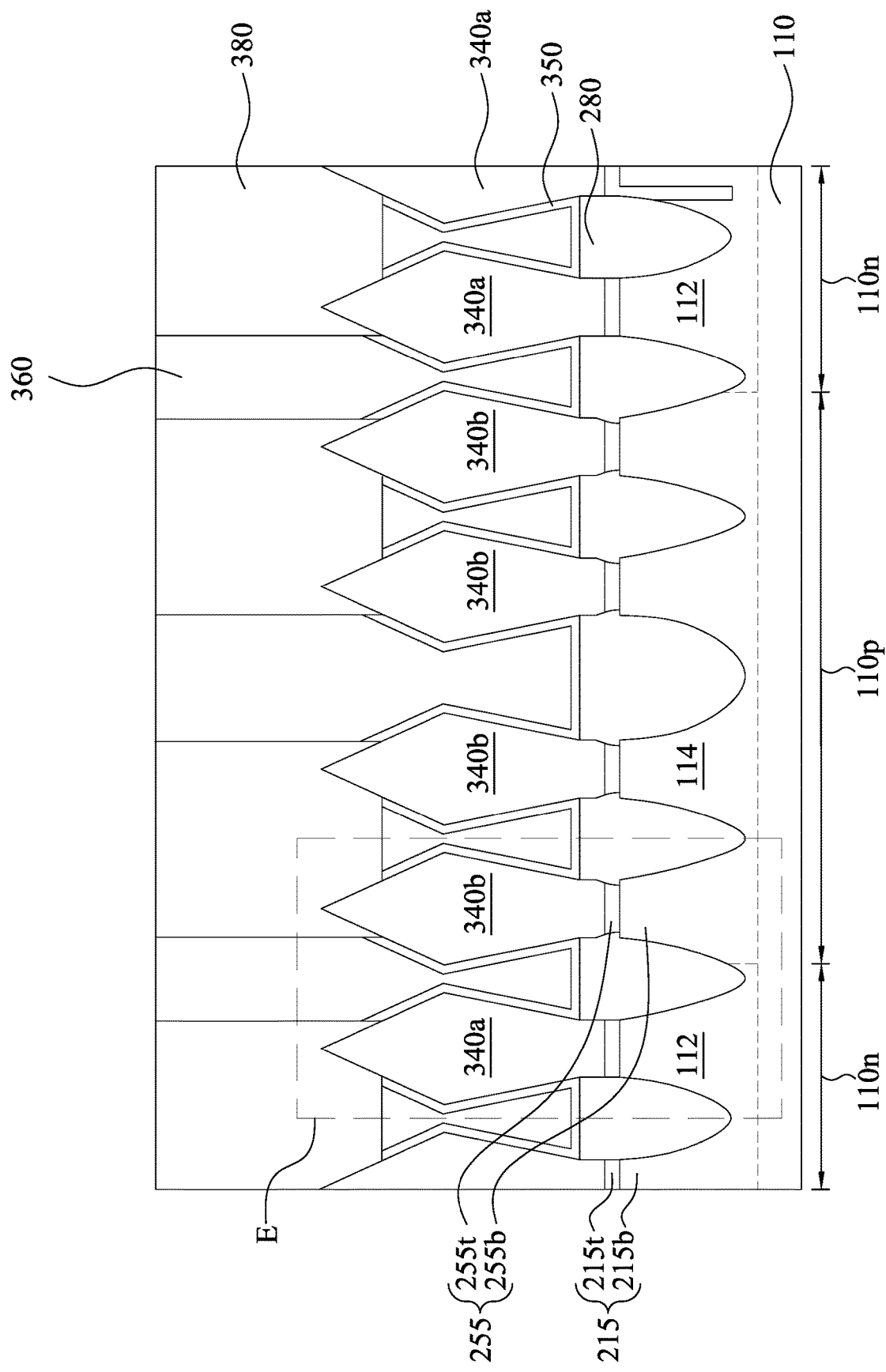

Reference is made to FIGS. 17A, 17B, and 17C, where FIG. 17B is a cross-sectional view taken along line B-B in FIG. 17A, and FIG. 17C is a cross-sectional view taken along line C-C in FIG. 17A. A plurality of contacts 380 are formed over the epitaxial structures 340a and 340b. For example, openings are formed in the ILD 360, and conductive materials are filled in the openings. The excess portions of the conductive materials are removed to form the contacts 380. The contacts 380 may be made of tungsten, aluminum, copper, or other suitable materials.

In FIGS. 17A and 17B, the first semiconductor fins 215, the epitaxial structure 340a, and a portion of the metal gate structure 370 form an N-type semiconductor device, and the second semiconductor fins 255, the epitaxial structure 340b, and another portion of the metal gate structure 370 form a P-type semiconductor device. Each of the first semiconductor fins 215 includes the bottom portion 215b and the top portion 215t above the bottom portion 215b, as described above. Moreover, each of the second semiconductor fins 255 includes the bottom portion 255b and the top portion 255t above the bottom portion 255b, as described above. The top portion 255t has the neck part 256 in contact with the bottom portion 255b. The top portions 215t and 255t are made of different materials. For example, a Ge concentration in the top portions 255t is higher than a Ge concentration in the top portions 215t.

Figure 17D:
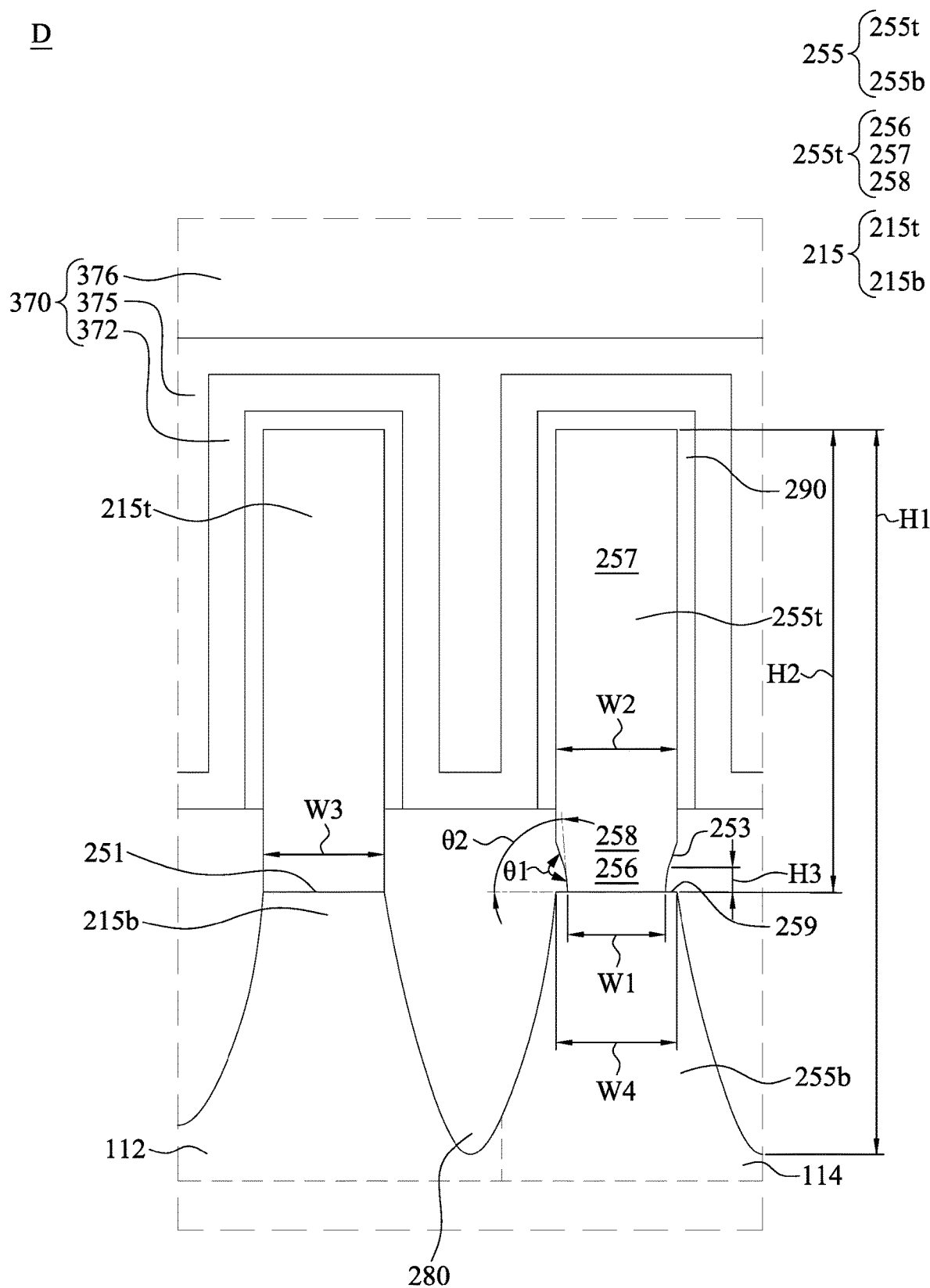

FIG. 17D is an enlarged view of the area D in FIG. 17B. Reference is made to FIGS. 17B and 17D. In some embodiments, the height H1 of the second semiconductor fins 255 (or the first semiconductor fins 215) is in a range of about 90 nm to about 140 nm, e.g., greater than about 100 nm and may be about 130 nm. Further, a height H2 of the top portions 255t (or 215t) of the second semiconductor fins 255 (or the first semiconductor fins 215) is in a range of about 40 nm to about 70 nm, e.g., about 54 nm. A pitch P1 between two adjacent first semiconductor fins 215 is in a range of about 20 nm to about 50 nm, and a pitch P2 between two adjacent second semiconductor fins 255 is in a range of about 20 nm to about 100 nm.

The top portion 215t of each of the second semiconductor fins 255 includes the neck part 256 and a head part 257 above the neck part 256. That is, the neck part 256 is between the head part 257 and the bottom portion 255b. The head part 257 may be referred to as a channel of the semiconductor device. The neck part 256 has a width W1 less than a width W2 of the head part 257. The width W1 of the neck part 256 is in a range of about 4 nm to about 8 nm. If the width W1 is less than about 4 nm, the top portion 255t may collapse; if the width W1 is greater than about 8 nm, the semiconductor device may have leakage current problems. In some embodiments, the neck part 256 has a height H3 in a range of about 5 nm to about 20 nm. If the height H3, which corresponds to the thickness T1 of the mask layer 230 shown in FIG. 5B, is less than about 5 nm, the mask layer 230 may not reduce the etching rate sufficiently, and leakage current problems may occur; if the height H3 is greater than about 20 nm, the top portions 255t may collapse. The cap layer 290 is conformal to the head part 257 and spaced apart from the neck part 256 and a tapered part 258. Moreover, a bottom of the top portion 215t of the first semiconductor fin 215 has a width W3 greater than the width W1 of the neck part 256. Further, a (minimum) width W4 of the bottom portion 255b of the second semiconductor fin 255 is greater than the width W1 of the neck part 256.

The top portion 215t of each of the second semiconductor fins 255 further includes the tapered part 258 between the head part 257 and the neck part 256. A width of the tapered part 258 tapers toward the neck part 256. The sidewalls 253 of the tapered part 258 have a {111} surface orientation. The sidewall 253 of the tapered part 258 and the sidewall of the neck part 256 form an obtuse angle θ1.

The bottom portion 255b of each of the second semiconductor fins 255 has a width greater than the width W1 of the neck part 256 and gets greater toward the substrate 110. A part of a top surface 259 of the bottom portion 255b is exposed by the neck part 256, and the top surface 259 of the bottom portion 255b and the sidewall of the neck part 256 form another angle θ2 in a range of about 80 degrees to about 135 degrees. The numerical value of angle θ2 depends on the profile of the spacer structures 240 shown in FIG. 6B.

In some embodiments, the sidewall of the head part 257 is substantially vertical (or straight), such that the width W2 remains the same from the top to bottom of the head part 257. In some embodiments, the sidewall of the top portion 215t of the first semiconductor fin 215 is substantially vertical (or straight), such that the width of the top portion 215t remains the same from the top to bottom of the top portion 215t. Alternatively, the top portion 215t of the first semiconductor fin 215 gets wider toward the substrate 110.

The semiconductor device further includes the isolation structures 280. The isolation structures 280 are in contact with the top surfaces 259 of the bottom portions 255b of the second semiconductor fins 255 but spaced part from the top surfaces 251 of the bottom portions 215b of the first semiconductor fins 215. The isolation structures 280 are further in contact with the {111} sidewalls 253 of the tapered parts 258, the neck parts 256, and the head parts 257. That is, the neck parts 256 and the tapered parts 258 are embedded in the isolation structures 280.

Figure 17E:
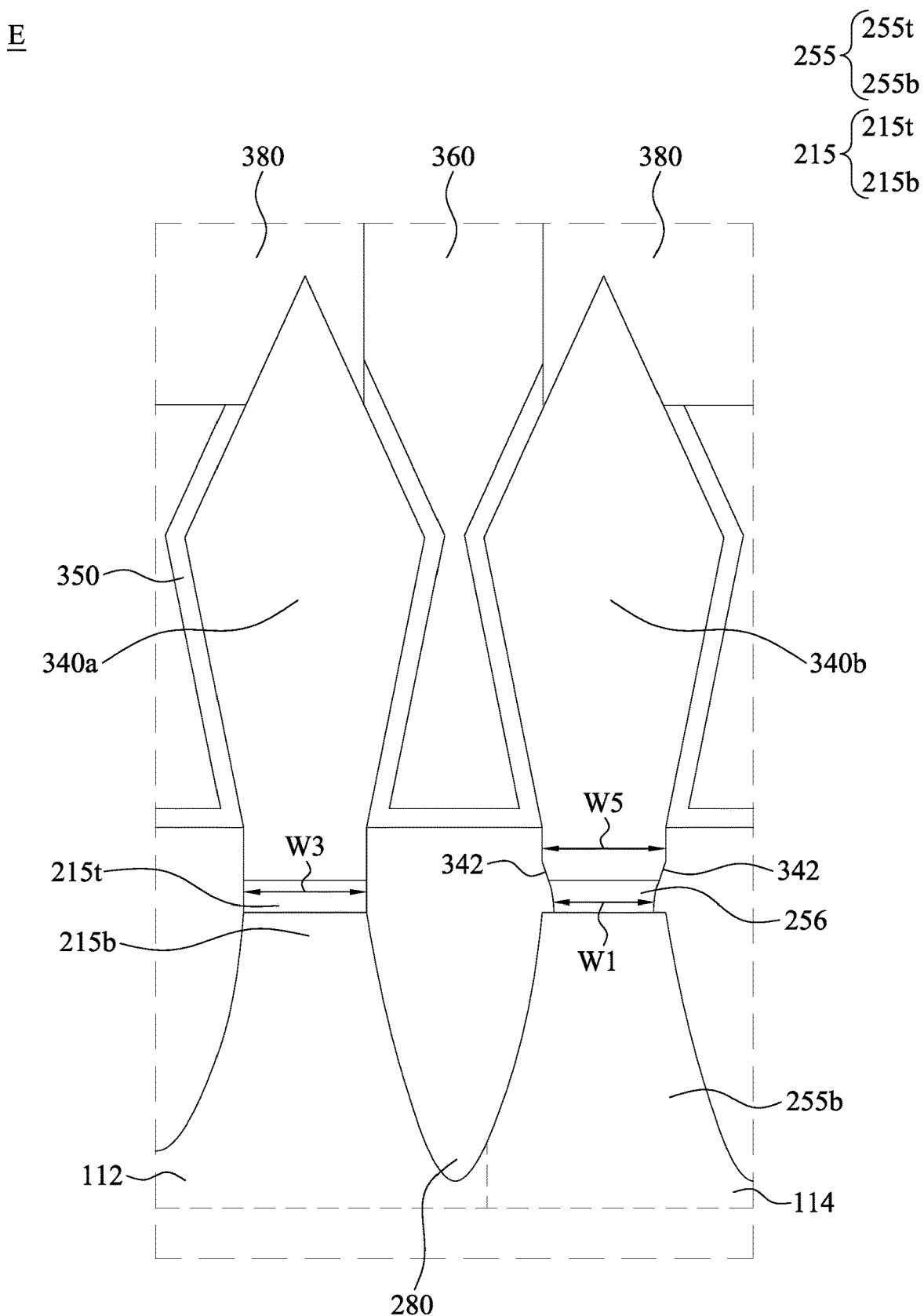

FIG. 17E is an enlarged view of the area E in FIG. 17C. As mentioned above, each of the epitaxial structures 340a is formed above the recessed top portion 215t of the corresponding first semiconductor fin 215, and each of the epitaxial structures 340b is formed above the recessed top portion 255t of the corresponding second semiconductor fin 255. As shown in FIG. 17E, the epitaxial structure 340b is formed above the neck part 256. A base portion 344 of the epitaxial structure 340b is embedded in the isolation structure 280 so that the base portion 344 inherits the profile of the tapered part 258 and the head part 257. That is, a bottom of the epitaxial structure 340b has {111} sidewalls 342. Further, the base portion 344 of the epitaxial structure 340b tapers toward the bottom portion 255b of the second semiconductor fin 255. That is, a (maximum) width W5 of the base portion 344 of the epitaxial structure 340b is greater than the width W1 of the neck part 256. In contrast, the bottom of the epitaxial structure 340a is not tapered or tapers toward the epitaxial structure 340a. Moreover, the recessed top portion 215t has the width W3 greater than the width W1 of the neck part 256.

Figure 18A:
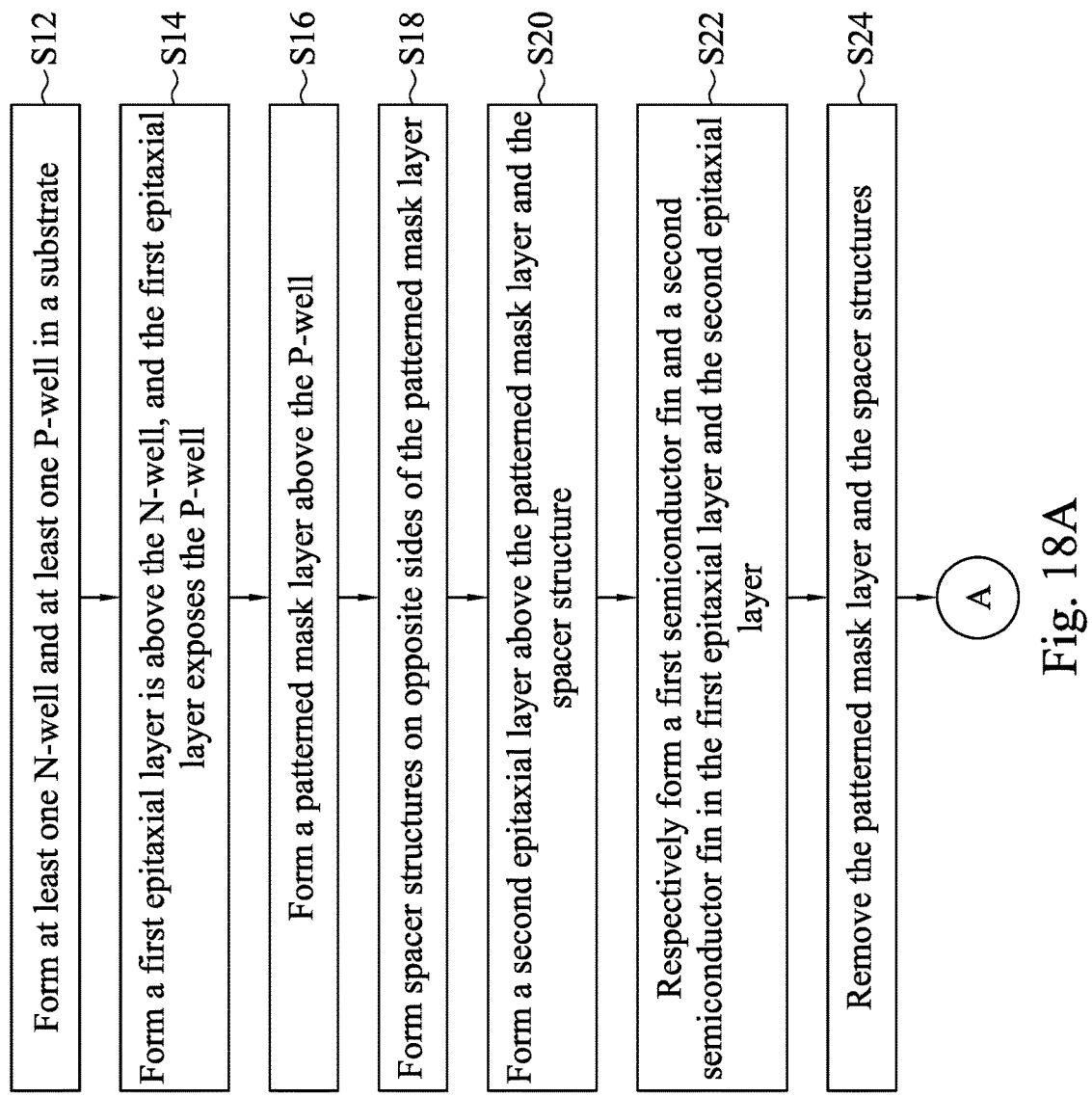
FIGS. 18A and 18B are a flow chart of a method for forming a memory device in accordance with some embodiments of the present disclosure.
Figure 18B:
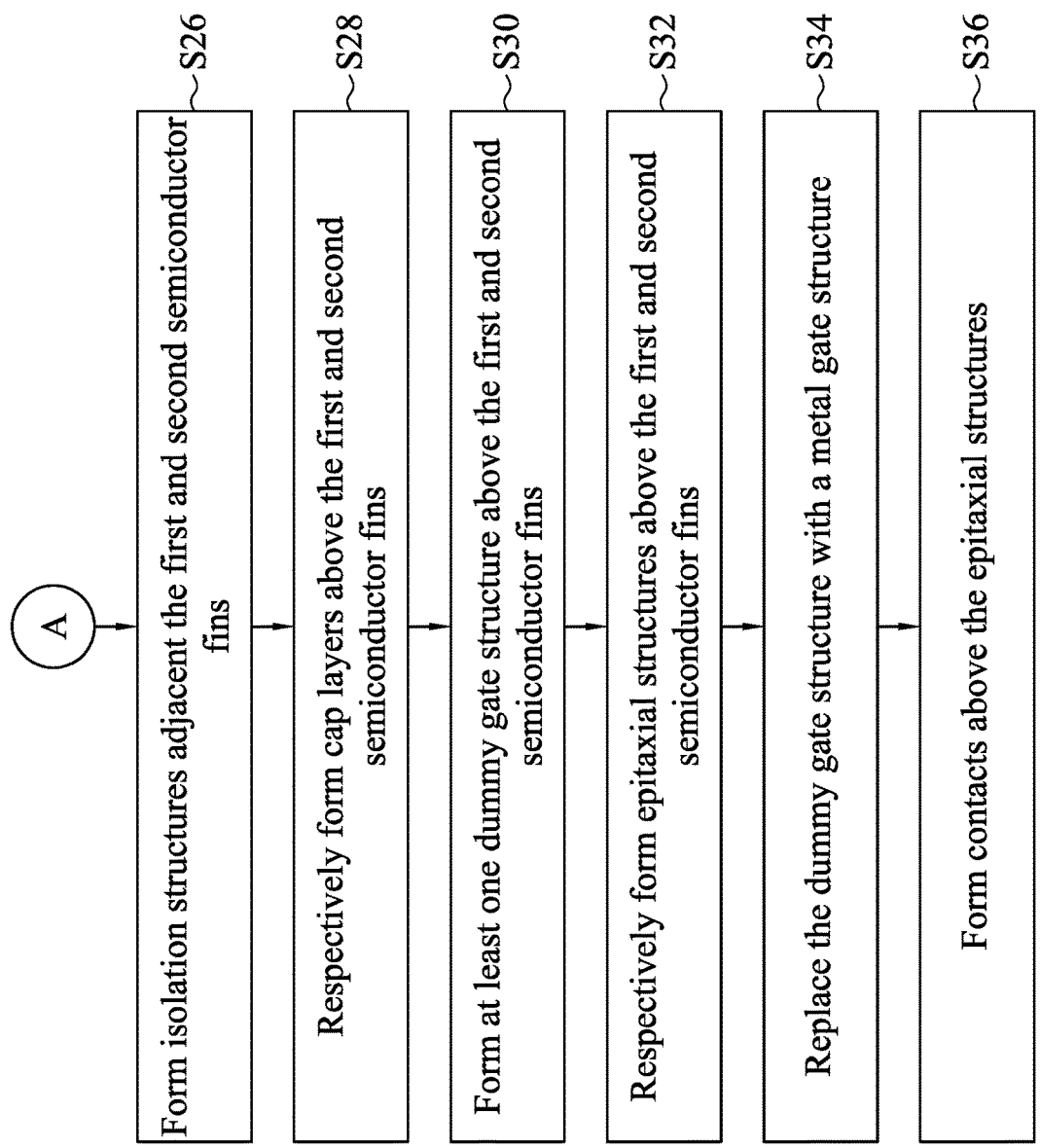

FIGS. 18A and 18B are a flow chart of a method M for forming a memory device in accordance with some embodiments of the present disclosure. Although the method M is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S12, at least one N-well and at least one P-well are formed in a substrate. FIGS. 1-2 illustrate perspective views of some embodiments corresponding to act in block S12. At block S14, a first epitaxial layer is formed above the N-well, and the first epitaxial layer exposes the P-well. FIGS. 3-4 illustrate perspective views of some embodiments corresponding to act in block S14. At block S16, a patterned mask layer is formed above the P-well. FIGS. 5A and 5B illustrate a perspective view and a cross-sectional view of some embodiments corresponding to act in block S16. At block S18, spacer structures are formed on opposite sides of the patterned mask layer. FIGS. 6A and 6B illustrate a perspective view and a cross-sectional view of some embodiments corresponding to act in block S18. At block S20, a second epitaxial layer is formed above the patterned mask layer and the spacer structure. FIGS. 7A and 7B illustrate a perspective view and a cross-sectional view of some embodiments corresponding to act in block S20. At block S22, a first semiconductor fin and a second semiconductor fin are respectively formed in the first epitaxial layer and the second epitaxial layer. FIGS. 8A-9B illustrate perspective views and cross-sectional views of some embodiments corresponding to act in block S22. At block S24, the patterned mask layer and the spacer structures are removed. FIGS. 10A and 10B illustrate a perspective view and a cross-sectional view of some embodiments corresponding to act in block S24. At block S26, isolation structures are formed adjacent the first and second semiconductor fins. FIGS. 11A and 11B illustrate a perspective view and a cross-sectional view of some embodiments corresponding to act in block S26. At block S28, cap layers are respectively formed above the first and second semiconductor fins. FIGS. 12A and 12B illustrate a perspective view and a cross-sectional view of some embodiments corresponding to act in block S28. At block S30, at least one dummy gate structure is formed above the first and second semiconductor fins. FIGS. 13A-13C illustrate a perspective view and cross-sectional views of some embodiments corresponding to act in block S30. At block S32, epitaxial structures are respectively formed above the first and second semiconductor fins. FIGS. 14A-14C illustrate a perspective view and cross-sectional views of some embodiments corresponding to act in block S32. At block S34, the dummy gate structure is replaced with a metal gate structure. FIGS. 16A-16C illustrate a perspective view and cross-sectional views of some embodiments corresponding to act in block S34. At block S36, contacts are formed above the epitaxial structures. FIGS. 17A-17C illustrate a perspective view and cross-sectional views of some embodiments corresponding to act in block S36.

Figure 19A:
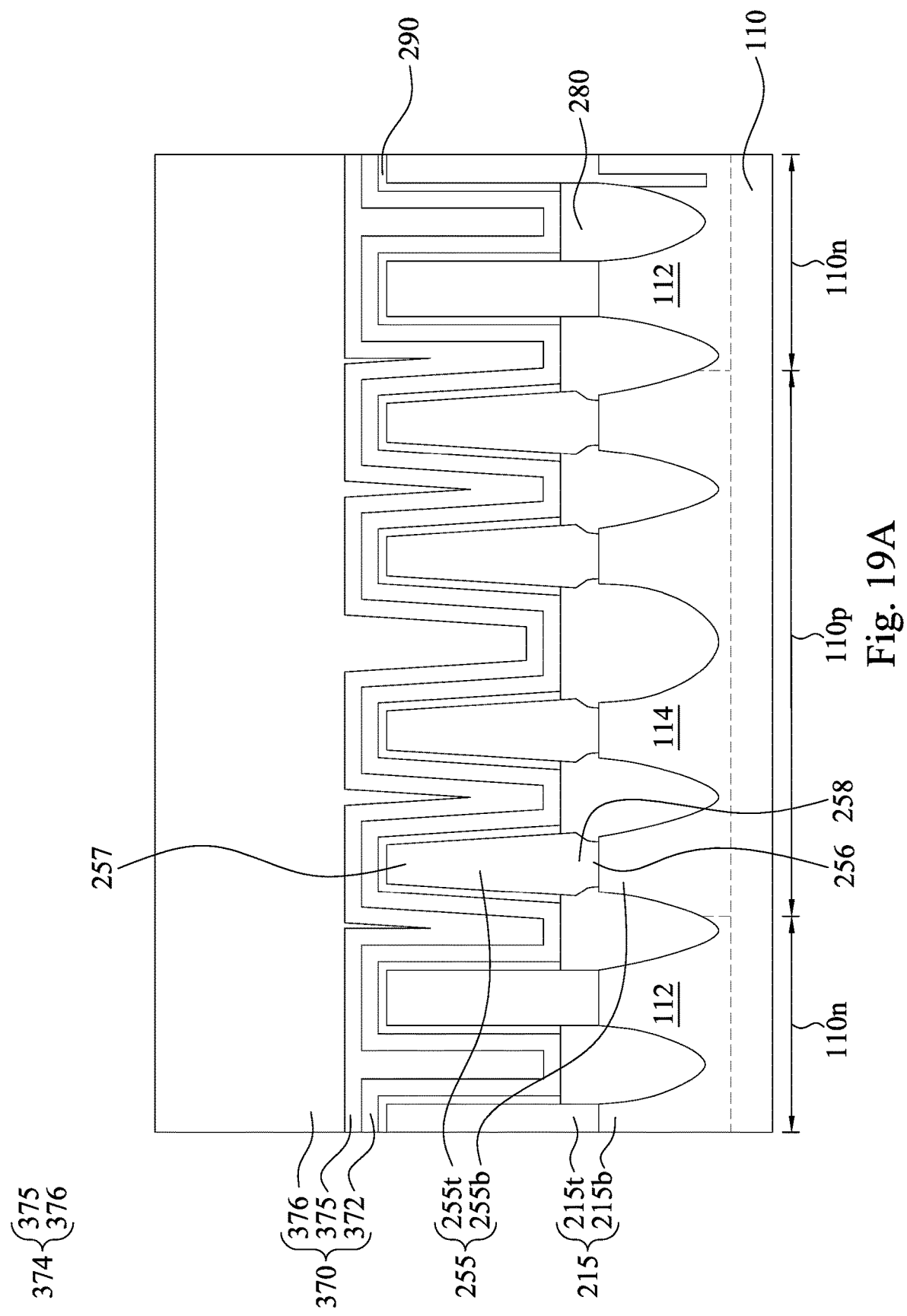
FIG. 19A is a cross-sectional view of a semiconductor device according to some embodiments.
Figure 19B:
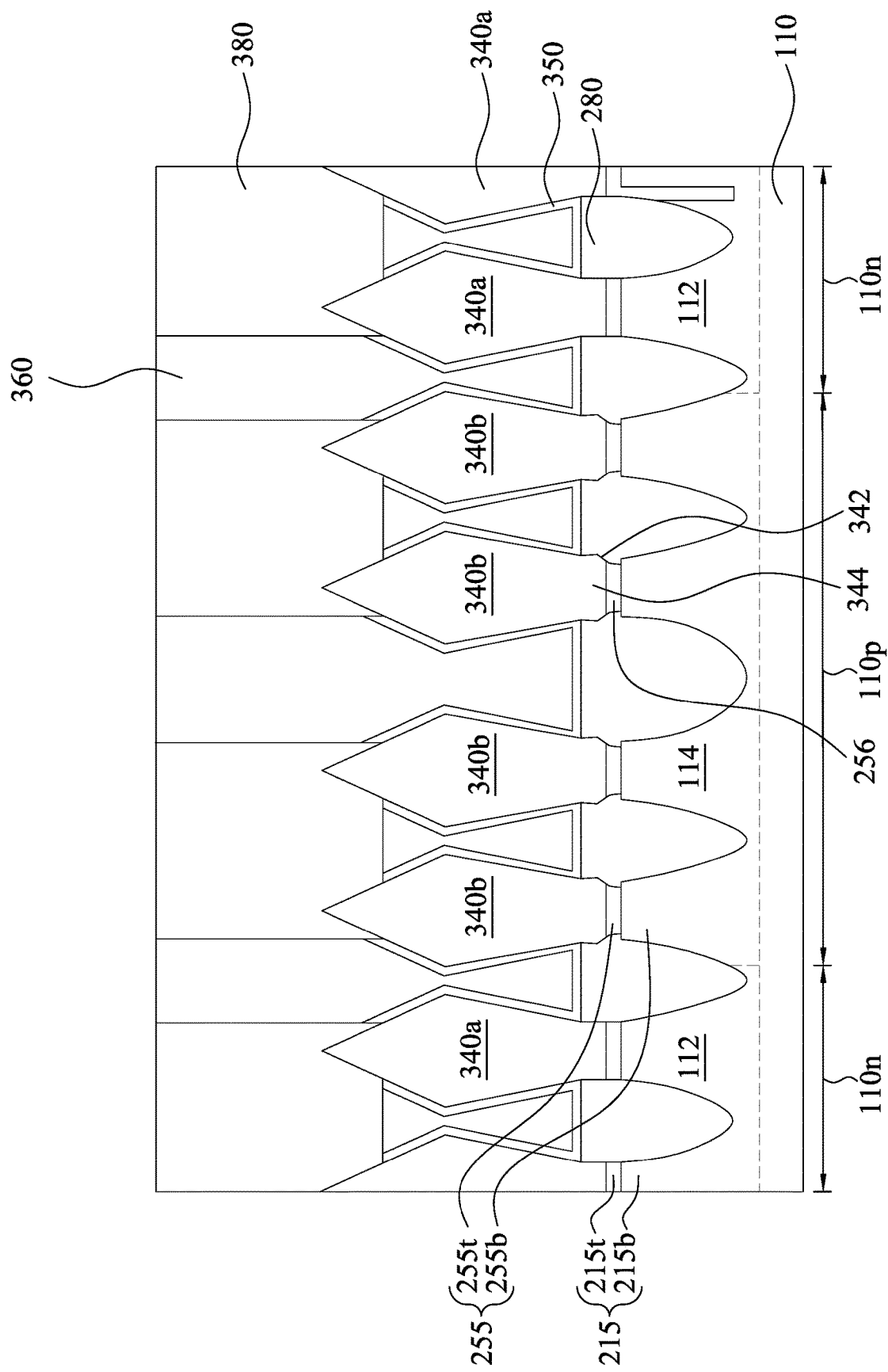
FIG. 19B is a cross-sectional view of the semiconductor device according to some embodiments.

FIG. 19A is a cross-sectional view of a semiconductor device according to some embodiments, and FIG. 19B is a cross-sectional view of the semiconductor device according to some embodiments. The cross-sectional position in FIG. 19A is the same as the cross-sectional position in FIG. 17B, and the cross-sectional position in FIG. 19B is the same as the cross-sectional position in FIG. 17C. The difference between the semiconductor devices in FIGS. 19A-19B and FIGS. 17A-17C pertains to the shape of the top portions 255$t$ of the second semiconductor fins 255. In FIG. 19A, for each of the second semiconductor fins 255, the head part 257 gets wider toward the neck part 256, such that the top portion 255$t$ gets wider and then narrower from top to bottom. The sidewall of the head part 257 is inclined. The part of the top portion 255$t$ that has the maximum width is embedded in the isolation structure 280 and above the neck part 256. An etching consume during the processes shown in FIGS. 9A and 9B (or FIGS. 10A and 10B) may result in the profile of the top portion 255$t$ shown in FIG. 19A. In FIG. 19B, a base portion 344 of the epitaxial structure 340$b$ gets wider and then narrower toward the neck part 256. That is, the base portion 344 has convex sidewalls. The base portion 344 is embedded in the isolation structure 280, and the base portion 342 has the {111} facets 342 facing downwardly. Other relevant structural details of the semiconductor device in FIGS. 19A and 19B are similar to the semiconductor device in FIGS. 17A-17C, and, therefore, a description in this regard will not be repeated hereinafter.

Figure 20A:
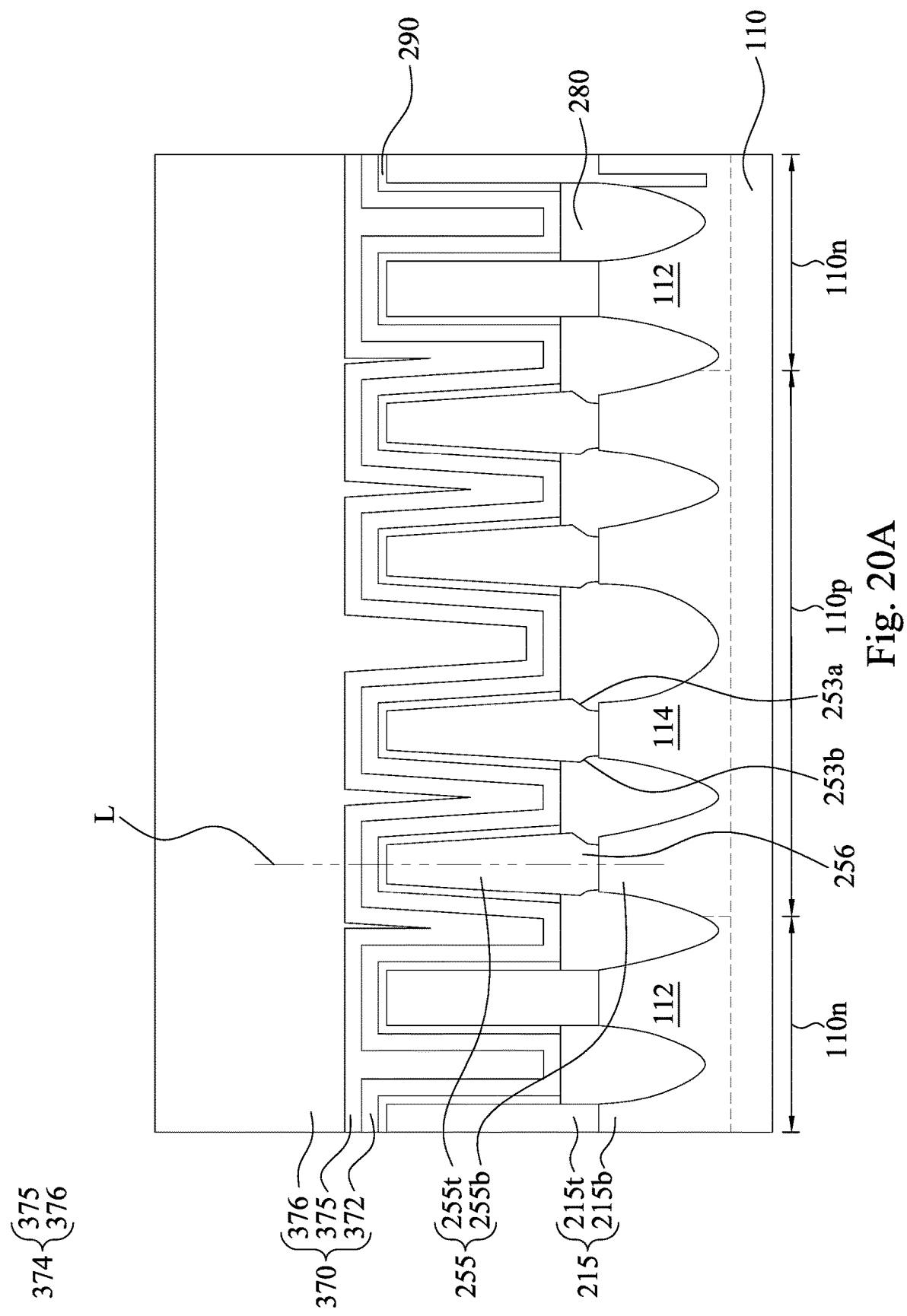
FIG. 20A is a cross-sectional view of a semiconductor device according to some embodiments.
Figure 20B:
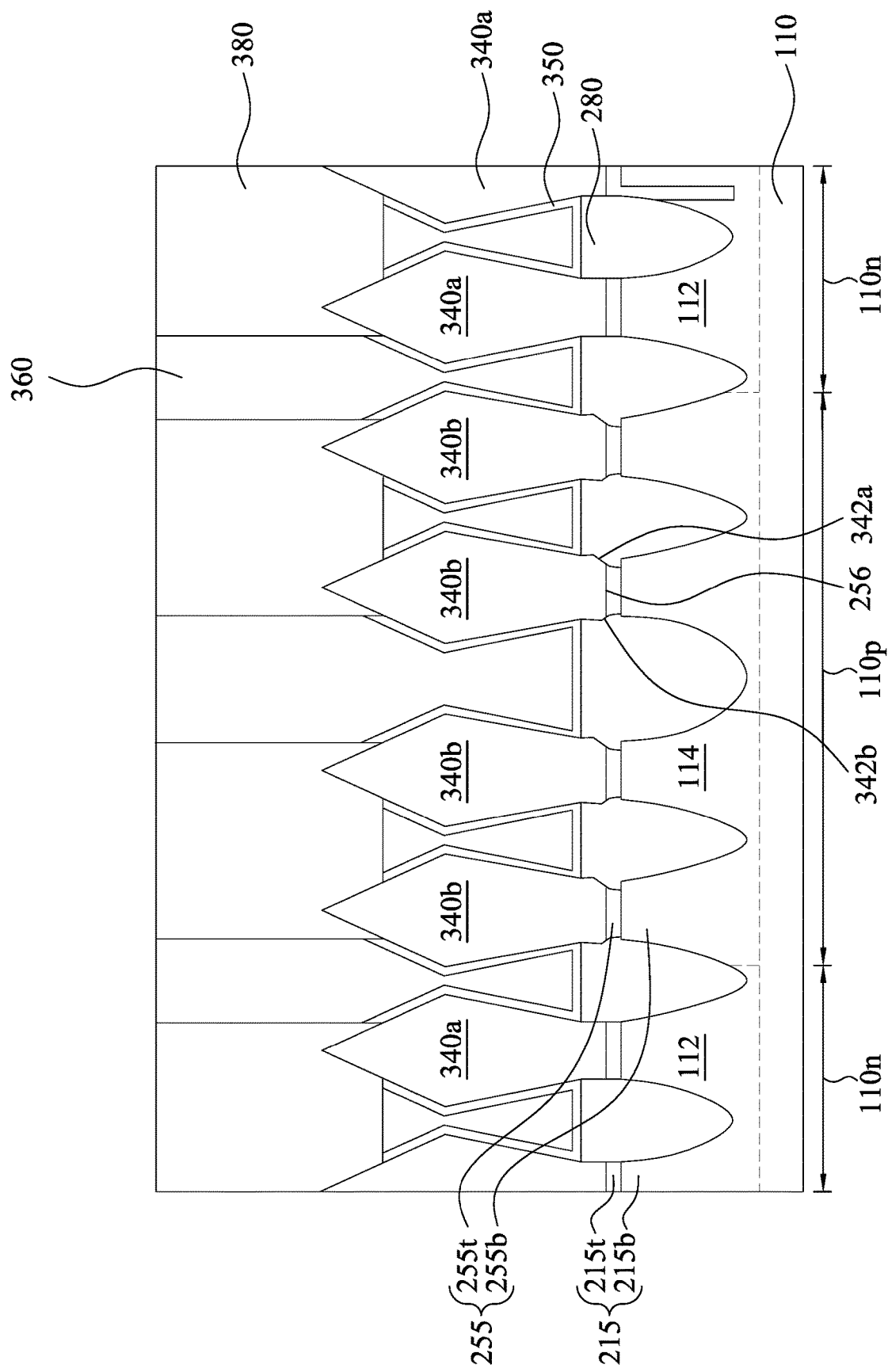
FIG. 20B is a cross-sectional view of the semiconductor device according to some embodiments.

FIG. 20A is a cross-sectional view of a semiconductor device according to some embodiments, and FIG. 20B is a cross-sectional view of the semiconductor device according to some embodiments. The cross-sectional position in FIG. 20A is the same as the cross-sectional position in FIG. 19A, and the cross-sectional position in FIG. 20B is the same as the cross-sectional position in FIG. 19B. The difference between the semiconductor devices in FIGS. 20A-20B and FIGS. 19A-19B pertains to the shape of the top portions 255$t$ of the second semiconductor fins 255. In FIG. 20A, for each of the second semiconductor fins 255, the top portion 255$t$ of the second semiconductor fin 255 is asymmetric with respect to a center line L of the second semiconductor fin 255. The profiles of the top portion 255$t$ shown in FIG. 20A may be due to the misalignment between the mask layer 270 in FIG. 9B and the mask layer 230 (and the spacer structures 240) in FIG. 8B. The {111} sidewall 253$a$ has a larger area than the {111} sidewall 253$b$. In FIG. 20B, the neck part 256 is misaligned with the bottom portion 255$b$. Further, the {111} sidewall 342$a$ has a larger area than the {111} sidewall 342$b$. Other relevant structural details of the semiconductor device in FIGS. 20A and 20B are similar to the semiconductor device in FIGS. 19A and 19B, and, therefore, a description in this regard will not be repeated hereinafter.

Based on the above discussion, it can be seen that the present disclosure offers advantages. It is understood, however, that other embodiments may offer additional advantages, and not all advantages are necessarily disclosed herein. It is further understood that no particular advantages are required for all embodiments. One advantage is that the patterned mask layer (and the spacer structures) improves the etching rate mismatch between first and second epitaxial layers. As a result, the first and second semiconductor fins have similar or substantially the same heights, resulting in good well-implant efficiency. Furthermore, the neck parts formed in the second semiconductor fins improve the leakage current problem and the drain induced barrier lowering (DIBL) effect. Another advantage is that the widths of the first and second semiconductor fins can be adjusted for tuning the bias voltages of the subsequently formed N-type semiconductor device and the P-type semiconductor device.

According to some embodiments, a semiconductor device includes a semiconductor fin and a gate structure above the semiconductor fin. The semiconductor fin includes a bottom portion and a top portion above the bottom portion. The bottom portion and the top portion are made of different materials. The top portion includes a head part and a neck part between the head part and the bottom portion. The neck part has a width less than a width of the head part, and the neck part is in contact with the bottom portion.

According to some embodiments, a semiconductor device includes a semiconductor fin, an isolation structure, a gate structure, and an epitaxial structure. The semiconductor fin includes a bottom portion and a top portion above the bottom portion. The top portion has a neck part having a width less than a width of the bottom portion. The isolation structure is adjacent the semiconductor fin. The gate structure is above the semiconductor fin and the isolation structure. The epitaxial structure is above the neck part of the semiconductor fin and adjacent the gate structure. The epitaxial structure includes a base portion embedded in the isolation structure, and the base portion has a width greater than the width of the neck part of the top portion of the semiconductor fin.

According to some embodiments, a method for manufacturing a semiconductor device includes forming a first patterned mask layer over a substrate, wherein the first patterned mask layer includes mask portions separated from each other. An epitaxial layer is formed above the first patterned mask layer and the substrate. The epitaxial layer, the first patterned mask layer, and the substrate are etched to form at least one semiconductor fin. An isolation structure is formed adjacent the semiconductor fin. A gate structure is formed above the semiconductor fin and the isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   implanting a substrate;
   after implanting the substrate, forming a first patterned mask layer over the substrate, wherein the first patterned mask layer comprises mask portions separated from each other;
   depositing an epitaxial layer above the first patterned mask layer and in contact with the substrate;
   etching the epitaxial layer, the first patterned mask layer, and the substrate to form at least one semiconductor fin;
   forming an isolation structure adjacent the semiconductor fin; and
   forming a gate structure above the semiconductor fin and the isolation structure.

2. The method of claim 1, further comprising forming spacer structures on opposite sidewalls of the mask portions of the first patterned mask layer before depositing the epitaxial layer.

3. The method of claim 2, further comprising removing the spacer structures after etching the epitaxial layer, the first patterned mask layer, and the substrate.

4. The method of claim 1, wherein etching the epitaxial layer, the first patterned mask layer, and the substrate comprises:
   forming a second patterned mask layer above the epitaxial layer, wherein the second patterned mask layer has at least one opening overlapping one of the mask portions of the first patterned mask layer; and
   etching the epitaxial layer, the first patterned mask layer, and the substrate by using the second patterned mask layer as masks.

5. The method of claim 1, wherein the epitaxial layer and the substrate are made of different materials.

6. The method of claim 1, wherein the epitaxial layer is spaced apart from top surfaces of the mask portions of the first patterned mask layer.

7. A method for manufacturing a semiconductor device, comprising:
   depositing a first epitaxial layer over a substrate;
   forming a trench in the first epitaxial layer such that the trench exposes the substrate;
   forming a plurality of masks in the trench and on the substrate, wherein top surfaces of the plurality of masks are lower than a top surface of the first epitaxial layer;
   depositing a second epitaxial layer over the plurality of masks and in the trench;
   patterning the second epitaxial layer, the plurality of masks, and the substrate to form a fin structure; and
   forming a gate structure over the fin structure.

8. The method of claim 7, further comprising forming spacer structures on opposite sides of the plurality of masks prior to depositing the second epitaxial layer.

9. The method of claim 8, wherein forming the spacer structures is such that tops of the spacer structures are lower than the top surface of the first epitaxial layer.

10. The method of claim 8, further comprising removing the spacer structures after patterning the second epitaxial layer, the plurality of masks, and the substrate.

11. The method of claim 7, wherein remaining portions of the plurality of masks remain on sidewalls of the fin structure, and the method further comprises removing the remaining portions of the plurality of masks after patterning the second epitaxial layer, the plurality of masks, and the substrate.

12. The method of claim 11, further comprising forming an isolation structure on sidewalls of the fin structure after removing the remaining portions of the plurality of masks.

13. The method of claim 7, wherein forming the plurality of masks is such that at least one of the plurality of masks is in contact with the first epitaxial layer.

14. A method for manufacturing a semiconductor device, comprising:
   depositing a first epitaxial layer over a substrate;
   forming a trench in the first epitaxial layer;
   forming a dielectric structure in the trench of the first epitaxial layer;
   depositing a second epitaxial layer over the substrate and in the trench of the first epitaxial layer such that a void is defined by the second epitaxial layer and the dielectric structure;
   patterning the first epitaxial layer, the second epitaxial layer, the dielectric structure, and the substrate to form a first fin structure comprising a portion of the first epitaxial layer and a portion of the substrate and a second fin structure comprising a portion of the second epitaxial layer and another portion of the substrate; and
   forming a gate structure to cover the first and second fin structures.

15. The method of claim 14, further comprising forming an isolation structure laterally surrounding the first and second fin structures.

16. The method of claim 15, wherein forming the isolation structure is such that the isolation structure is in contact with a top surface of the portion of the substrate of the second fin structure and is spaced apart from a top surface of the portion of the substrate of the first fin structure.

17. The method of claim 14, wherein patterning the first epitaxial layer, the second epitaxial layer, the dielectric structure, and the substrate is such that a bottom of the portion of the second epitaxial layer of the second fin structure tapers downwards.

18. The method of claim 14, wherein patterning the first epitaxial layer, the second epitaxial layer, the dielectric structure, and the substrate is such that a bottom of the portion of the first epitaxial layer of the first fin structure has a substantially straight sidewall.

19. The method of claim 14, wherein the second epitaxial layer has a facet at a sidewall of the void.

20. The method of claim 14, wherein a thickness of the dielectric structure is in a range of about 2 nm to about 20 nm.

\* \* \* \* \*